US011227888B2

(12) United States Patent
Hatano et al.

(10) Patent No.: US 11,227,888 B2
(45) Date of Patent: Jan. 18, 2022

(54) IMAGING DEVICE, APPARATUS AND METHOD FOR PRODUCING THE SAME AND ELECTRONIC APPARATUS

(71) Applicant: Sony Semiconductor Solutions Corporation, Kanagawa (JP)

(72) Inventors: Keisuke Hatano, Kanagawa (JP); Atsushi Toda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 543 days.

(21) Appl. No.: 14/476,469

(22) Filed: Sep. 3, 2014

(65) Prior Publication Data

US 2015/0069564 A1 Mar. 12, 2015

(30) Foreign Application Priority Data

Sep. 10, 2013 (JP) .............................. JP2013-186980

(51) Int. Cl.
*H01L 27/146* (2006.01)

(52) U.S. Cl.
CPC .... *H01L 27/14629* (2013.01); *H01L 27/1464* (2013.01); *H01L 27/14627* (2013.01); *H01L 27/14636* (2013.01); *H01L 27/14685* (2013.01)

(58) Field of Classification Search
CPC ......... H01L 27/14629; H01L 27/14685; H01L 27/14636; H01L 27/1464; H01L 27/14627
See application file for complete search history.

(56) References Cited

U.S. PATENT DOCUMENTS

| 2010/0178018 A1* | 7/2010 | Augusto | H01L 27/14685 385/131 |
| 2010/0203665 A1* | 8/2010 | Park | H01L 27/14632 438/70 |
| 2011/0032376 A1* | 2/2011 | Takizawa | H01L 27/307 348/222.1 |
| 2011/0279727 A1* | 11/2011 | Kusaka | H04N 5/3696 348/340 |
| 2014/0145287 A1* | 5/2014 | Kato | H01L 27/14625 257/432 |

FOREIGN PATENT DOCUMENTS

JP 2008-147333 A 6/2008

OTHER PUBLICATIONS

Official Action (with English translation) for Chinese Patent Application No. 201410447006.3, dated Mar. 14, 2018, 20 pages.

* cited by examiner

*Primary Examiner* — Vongsavanh Sengdara
(74) *Attorney, Agent, or Firm* — Sheridan Ross P.C.

(57) ABSTRACT

Solid-state imaging devices, methods to produce the solid-state imaging devices, and electronic apparatuses including the solid-state imaging devices, where the solid-state imaging devices include a semiconductor substrate including a light receiving surface; a plurality of photoelectric conversion parts provided within the semiconductor substrate; and a plurality of reflection portions provided in the semiconductor substrate on a side of the photoelectric conversion parts that is opposite from the light receiving surface; where each of the reflection portions includes a reflection plate and a plurality of metal wirings, and where the plurality of metal wirings are disposed in a same layer of the semiconductor substrate as the reflection plate.

20 Claims, 19 Drawing Sheets

IMAGING DEVICE, APPARATUS AND METHOD FOR PRODUCING THE SAME AND ELECTRONIC APPARATUS

CROSS REFERENCE TO RELATED APPLICATIONS

This application claims the benefit of Japanese Priority Patent Application JP 2013-186980 filed Sep. 10, 2013, the entire content of which is incorporated herein by reference.

BACKGROUND

The present disclosure relates to imaging devices, apparatuses and methods for producing the imaging devices, and electronic apparatuses. More specifically, the present disclosure relates to imaging devices suitable for enhancing the sensitivity, apparatuses and methods for producing such imaging devices, and electronic apparatuses suitable for enhancing the sensitivity.

In recent years, imaging devices having two-dimensionally arranged CCDs (charge coupled devices), CMOS (complementary metal-oxide semiconductor) elements or the like have been used in digital video cameras, digital still cameras, and so on. Typically, an imaging device is produced by forming a photoelectric conversion part or a diffusion layer to a substrate by dopant introduction such as ion implantation; and then forming a wiring layer and an insulating film by depositing and processing a film. Light entering the imaging device would be absorbed by the photoelectric conversion part and converted into electric charges. By storing these electric charges in the photoelectric conversion part, and by detecting total amount of the charges being stored, a signal according to incident light intensity would be obtained.

However, if a penetration length of the incident light is greater than a thickness of the substrate, the incident light would not be sufficiently absorbed by the photoelectric conversion part. Light utilization efficiency may therefore be decreased. An example of a way of allowing enhancement of sensitivity by allowing long-wavelength light being transmitted through the photoelectric conversion part to be effectively converted into electric charges, has been suggested in Japanese Patent Application Laid-Open No. 2008-147333 (hereinafter referred to as "Patent Document 1").

SUMMARY

In the imaging device according to Patent Document 1, a reflection plate is made of the same material as a metal wiring layer. The metal wiring layer may be used as a connecting wiring of the amplifier transistor for taking out photoelectric conversion signals, or the like.

The regions where the reflection plate can be formed are other than the regions provided with the wirings, so the layout area would be limited. Because of that, there has been a limit in a reflection efficiency of the reflection plate for reflecting light.

In addition, in cases where the light enters the reflection plate from an oblique direction and the incidence angle of the light is relatively large, the light may enter the regions out of the region where the reflection plate has been formed. It may thus fail to obtain a sufficient effect of the reflection plate and result in significant changes in the sensitivity characteristics, which changes may depend on the incidence angle of the light.

It has been desired to enhance sensitivity characteristics of imaging devices.

In view of the above-mentioned circumstances, it may be desirable to allow enhancement of the sensitivity characteristics.

According to various embodiments of the present disclosure, there is provided solid-state imaging devices, including: a semiconductor substrate including a light receiving surface; a plurality of photoelectric conversion parts provided within the semiconductor substrate; and a plurality of reflection portions provided in the semiconductor substrate on a side of the photoelectric conversion parts that is opposite from the light receiving surface; where each of the reflection portions includes a reflection plate and a plurality of metal wirings, and where the plurality of metal wirings are disposed in a same layer of the semiconductor substrate as the reflection plate.

According to further various embodiments of the present disclosure, there is provided methods of manufacturing an imaging device, the method including: providing a semiconductor substrate having a light receiving surface and a plurality of photoelectric conversion parts within the semiconductor substrate; and providing a plurality of reflection portions in the semiconductor substrate on a side of the photoelectric conversion parts that is opposite from the light receiving surface; where each of the reflection portions includes a reflection plate and a plurality of metal wirings, and where the plurality of metal wirings are disposed in a same layer of the semiconductor substrate as the reflection plate.

According to still further various embodiments of the present disclosure, there is provided electronic apparatuses omc;idomg: an imaging device including: a semiconductor substrate including a light receiving surface; a plurality of photoelectric conversion parts provided within the semiconductor substrate; and a plurality of reflection portions provided in the semiconductor substrate on a side of the photoelectric conversion parts that is opposite from the light receiving surface; where each of the reflection portions includes a reflection plate and a plurality of metal wirings, and where the plurality of metal wirings are disposed in a same layer of the semiconductor substrate as the reflection plate.

As described above, an embodiment of the present disclosure may make it possible to increase an amount of light that the imaging device receives, and allow enhancement of the sensitivity.

It should be noted that the effects described herein are non-limitative examples. For example, any one of the effects described herein may be an effect according to an embodiment of the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure (each of which will be referred to herein as an "embodiment") will be described with reference to the drawings. The description will be given in the following order:

1. Configuration of Imaging Device of First Embodiment
2. Configuration of Imaging Device of Second Embodiment
3. Configuration of Imaging Device of Third Embodiment
4. Configuration of Imaging Device of Fourth Embodiment
5. Configuration of Imaging Device of Fifth Embodiment
6. Configuration of Imaging Device of Sixth Embodiment
7. Configuration of Imaging Device of Seventh Embodiment
8. Configuration of Imaging Device of Eighth Embodiment
9. Process of Production of Imaging Device
10. Electronic Apparatus

[Configuration of Imaging Device of First Embodiment]

Figure 1:
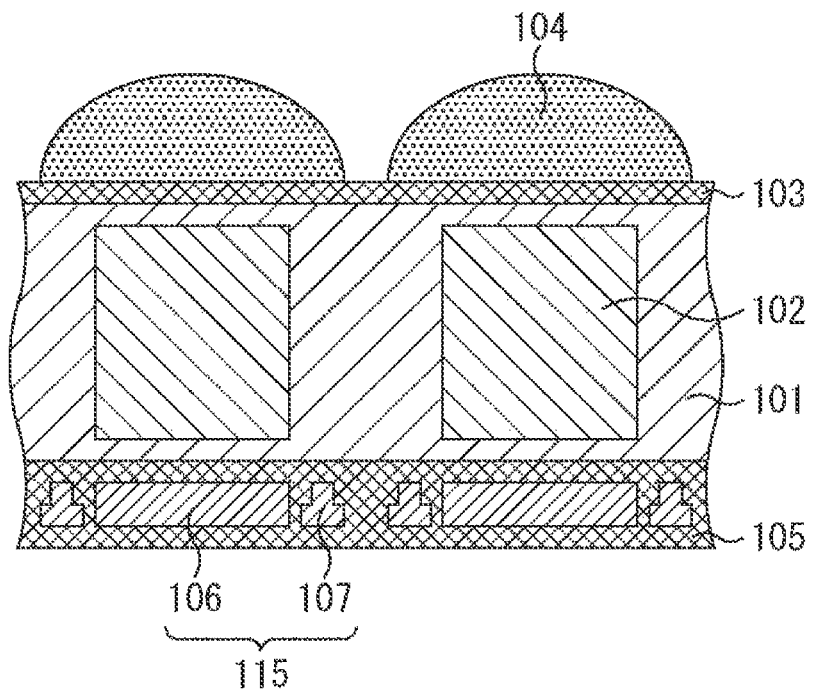
FIG. 1 is a cross-sectional view showing a pixel structure of an imaging device of a first embodiment.

FIG. 1 is a cross-sectional view showing a pixel structure of an imaging device having a reflection portion of a first embodiment of the present disclosure. In the following description, adjacent two pixels are shown in the figure, and these pixels are arranged in the rows and columns in a matrix of an arbitrary number of pixels. In addition, in the following, although a back-illuminated imaging device is illustrated as an example, the following description does not imply that the present disclosure applies only to back-illuminated imaging devices.

In the pixel structure shown in FIG. 1, some microlenses 104 are formed on an interlayer insulating film 103, over a silicon substrate 101 in which photoelectric conversion parts 102 are formed. Further, in a surface opposite to a light incidence surface provided with the microlenses 104, metal wirings 107 used for reading signal charges and applying voltages to each part are disposed.

Still further, in the same layer as the metal wirings 107, a reflection plate 106 is also disposed. As used herein, the term "same layer" may mean that at least one side of the reflection plate and the metal wirings are disposed at the same depth of the semiconductor substrate. In addition, the term "same layer" may mean that the reflection plate 106 and the metal wirings 107 are each a single layer within the same layer, that the reflection plate 106 and the metal wirings 107 do not overlap, or do not overlap in a vertical direction, and/or are at a same vertical height or distance A reflection portion 115 is made up of the reflection plate 106 and the metal wirings 107.

The metal wirings 107 may be formed separated from the reflection plate 106, by a space narrow enough so that passage therethrough of incident light would be inhibited. In addition, each metal wiring 107 has a relatively small film thickness in its part adjacent to the metal wiring 107 of an adjacent pattern thereto, as will be described later. For example, the distance between the reflection plate 106 and the metal wiring 107 may be 0.25 micrometers or less.

The reflection plate 106 may be formed by a metal film. The reflection plate 106 is provided for reflecting the light being transmitted through the silicon substrate 101 and allowing the light to enter the photoelectric conversion part 102 again. In this way, by providing the reflection plate 106, it makes it possible to increase an amount of light entering the photoelectric conversion part 102, and allow enhancement of the sensitivity.

Further, the metal wirings 107 are also formed by a metal, and as described above, used for reading signal charges and applying voltages to each part are disposed. The metal wirings also have a function of reflecting the light being transmitted through the silicon substrate 101 and allowing the light to enter the photoelectric conversion part 102 again.

Now, since the reflection plate 106 and the metal wirings 107 have the same function of reflecting the light being transmitted through the silicon substrate 101 and allowing the light to enter the photoelectric conversion part 102 again, the reflection plate 106 and the metal wirings 107 will be collectively referred to as the "reflection portion 115", as appropriate.

In order to effectively reflect the light that has transmitted through the silicon substrate 101 to the photoelectric conversion part 102, the size of the reflection portion 115 may be made as large as possible. In order to provide a larger size of the reflection portion 115 that includes the reflection plate 106 and the metal wirings 107, the reflection plate 106 and one or more of the metal wirings 107 may be formed together as one sheet of metal film, or the reflection plate 106 and the metal wiring 107 may be placed as close to each other as possible, instead of placing them separated from each other as shown in FIG. 1.

However, if the reflection plate 106 and the metal wirings 107 were to be formed together as one sheet of metal film, the metal wirings 107 would no longer function as a wiring. Therefore, it may be necessary that the reflection plate 106 and the metal wiring 107 be provided separated from each other. Between the reflection plate 106 and the metal wiring 107, an insulating film 105 may be provided. Thus, in cases where the reflection plate 106 and the metal wiring 107 are to be provided separated from each other, the size of the reflection portion 115 may be largest when the reflection plate 106 and the metal wiring 107 are placed in close proximity, but not in contact, with each other.

Yet, when the reflection plate 106 and the metal wiring 107 are placed in close proximity, a parasitic capacitance may appear between the reflection plate 106 and the metal wiring 107. In order to minimize the parasitic capacitance, the reflection plate 106 and the metal wiring 107 may be placed at some distance from each other.

Accordingly, a shape of each metal wiring 107 may be one as shown in FIG. 1. The metal wiring 107 has a stepped shape as viewed in a cross section. In FIG. 1, the metal wiring 107 has a shape in which two squares, large and small, are combined. A small square-shape metal wiring 107 is provided on the microlens 104 side of a large square-shape metal wiring 107 lying underneath.

Figure 2:
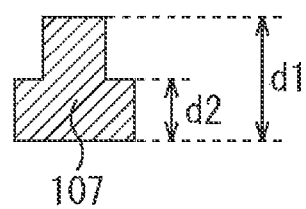
FIG. 2 is a figure for illustrating a shape of a metal wiring.

FIG. 2 shows the metal wiring 107 separately. As the metal wiring 107 is a metal film, the shape of the metal wiring 107 will hereinafter be described by film thickness. As shown in FIG. 2, the metal wiring 107 has two types of film thicknesses. The larger film thickness is a thickness d1 and the smaller film thickness is a thickness d2. Both edge parts of the metal wiring 107 have a film thickness of d2. A center part of the metal wiring 107 has a film thickness of d1.

In the description above, the "small square-shape metal wiring 107" corresponds to the part having a film thickness of (d1-d2), and represents the square shape having a height corresponding to the thickness (d1-d2). The "large square-shape metal wiring 107" corresponds to the part having a film thickness of d2, and represents the square shape having a height corresponding to the thickness d2.

Hereinafter, the part having a film thickness of d1 will be referred to as a "first film thickness part" and the part having a film thickness of d2 will be referred to as a "second film thickness part", as appropriate.

Referring back to FIG. 1, it can be seen that the first film thickness part of the metal wiring 107, which has the film thickness of d1, is located relatively distant from the reflection plate 106; and the second film thickness part of the metal wiring 107, which has the film thickness of d2, is located relatively close to the reflection plate 106. With such a configuration that includes a part where a distance between the reflection plate 106 and the metal wiring 107 is short and a part where the distance is long, it makes it possible to reduce the parasitic capacitance that appears between the reflection plate 106 and the metal wiring 107.

Figure 3A:
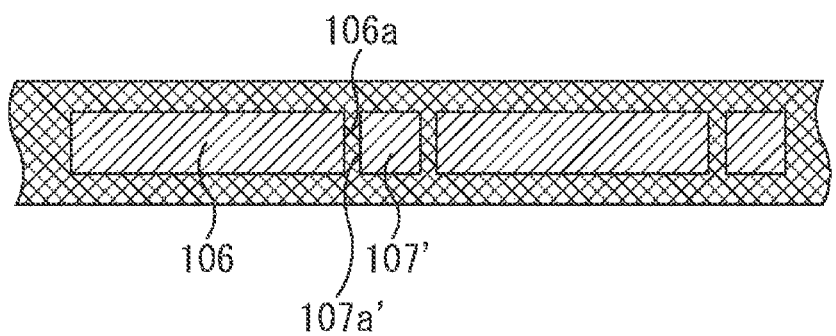
FIGS. 3A to 3D are figures for illustrating a difference in parasitic capacitances due to a difference in metal wirings.
Figure 3B:
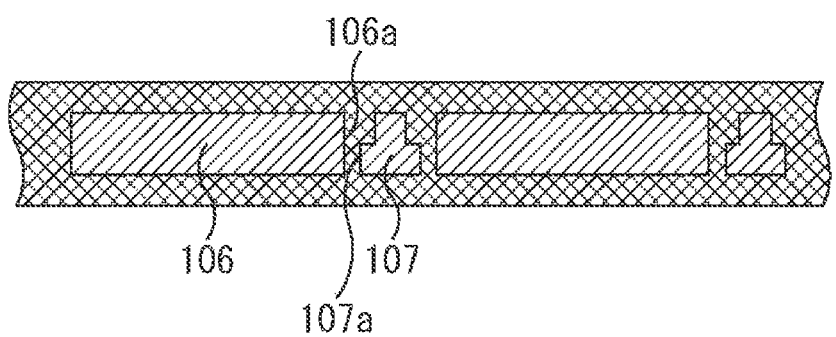

FIGS. 3A to 3D are figures for illustrating a difference in parasitic capacitances, by comparing a case where the metal wiring 107 having varied film thicknesses as shown in FIGS. 1 and 2 is used and a case where a metal wiring 107' having a uniform thickness (denoted with a prime symbol to be distinguished from the metal wiring 107 of FIGS. 1 and 2) is used. FIG. 3A shows the metal wiring 107' having a uniform thickness and FIG. 3B shows the metal wiring 107 having varied film thicknesses.

As the metal wiring 107' of FIG. 3A has a uniform thickness, a cross section thereof has a square shape. As shown in FIG. 3A, in cases where the metal wiring 107' having the square shape is used, a side 107a' of the metal wiring 107' and a side 106a of the reflection plate 106 would be sides facing each other and located parallel to each other.

As the metal wiring 107 of FIG. 3B has varied film thicknesses, a side 107a of the metal wiring 107 and the side 106a of the reflection plate 106 would be sides facing each other and located parallel to each other. If assumed that a length of the side 107a' of the metal wiring 107' is the same length as the thickness d1, the side 107a' would have a length of d1. As a length of the side 107a of the metal wiring 107 corresponds to the thickness d2, the side 107a would have a length of d2.

As has been described with reference to FIG. 2, a relationship of d1>d2 is satisfied. Accordingly, the side 107a' of the metal wiring 107' would be longer than the side 107a of the metal wiring 107, and would have a longer part parallel to the side 106a of the reflection plate 106. It is evident that when a space between the sides in such a parallel part is in the same size, the shorter the parallel part is, the smaller the parasitic capacitance may become.

Therefore, in the case where the metal wiring 107 having varied film thicknesses as shown in FIG. 3B is used, the parasitic capacitance becomes smaller than in the case where the metal wiring 107' having a uniform thickness as shown in FIG. 3A is used.

Figure 3C:
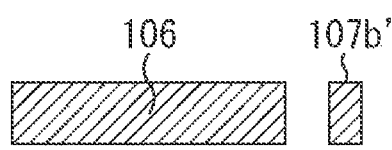
Figure 3D:

Furthermore, by allowing the parasitic capacitance to be reduced, it makes it possible to dispose the metal wiring 107 close to the reflection plate 106. FIGS. 3C and 3D will be referred. FIG. 3C shows the metal wiring 107' shown in FIG. 3A, and an upper side thereof is a side 107b'. FIG. 3D shows the metal wiring 107 shown in FIG. 3B; an upper side of the first film thickness part having the film thickness of d1 is a side 107b, and an upper side of the second film thickness part having the film thickness of d2 is a side 107c.

An upper side (the side closer to the photoelectric conversion part 102) of the metal wiring 107 has a function of reflecting the light being transmitted through the silicon substrate 101 to the photoelectric conversion part 102. While the upper side of the metal wiring 107' is only the side 107b', the upper side of the metal wiring 107 is made up of the side 107c+ the side 107b+ the side 107c.

If assumed that the side 107b' and the side 107b has the same length, the metal wiring 107 would have an upper side longer by a length of (the side 107c)−2 as compared to the upper side of the metal wiring 107'. This means that the metal wiring 107 has a relatively long part having the function of reflecting the light being transmitted through the silicon substrate 101 to the photoelectric conversion part 102; which may therefore allow the light transmitted through the silicon substrate 101 to be efficiently reflected to the photoelectric conversion part 102.

Thus, with the metal wiring 107 having the first film thickness part and the second film thickness part, it makes it possible to enhance the function of reflecting the light being transmitted through the silicon substrate 101 to the photoelectric conversion part 102.

Hereinafter, the first film thickness part and the second film thickness part will be referred, respectively, to as a "first film thickness part 107b" and a "second film thickness part 107c" having a film thickness of d2 will be referred to as a "second film thickness part", as appropriate. In the following descriptions as well, a part having a larger film thickness will be denoted by a reference numeral with a letter b, and a part having a smaller film thickness will be denoted by the reference numeral with a letter c.

The shape of the metal wiring 107 that provides the function of efficiently reflecting the light being transmitted through the silicon substrate 101 to the photoelectric conversion part 102 is not limited to the shape as has been illustrated with reference to FIGS. 1, 2, 3A and 3B. For example, it may be any shape as those shown in FIGS. 4A and 4B.

Figure 4A:
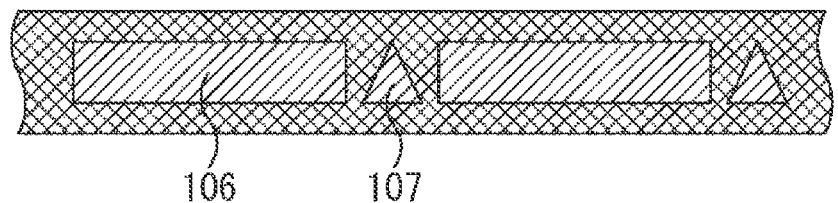
FIGS. 4A and 4B are figures for illustrating other shapes of the metal wiring.

FIG. 4A will be referred. A cross section of the metal wiring 107 shown in FIG. 4A has a triangular shape.

In the case of the triangular shape, a vertex part of the metal wiring 107 would be relatively distant from the reflection plate 106; and a part closer to the base of the triangle would be relatively close to the reflection plate 106. Since there are no sides parallel to the side of the reflection plate 106 in such a triangular shape, it may make it possible to reduce the parasitic capacitance that appears between the reflection plate 106 and the metal wiring 107.

In such a manner, the shape of the metal wiring 107 may be a shape with a gradually varied film thickness. The metal wiring 107 shown in FIG. 4A has a shape in which a center part thereof has the largest film thickness, and the more to the right or the left from the center part, the smaller the film thickness thereof becomes, gradually.

Figure 4B:
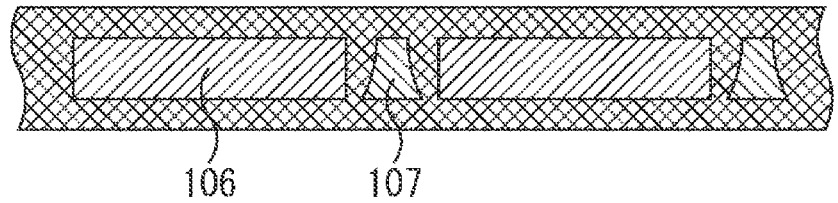

FIG. 4B will be referred. A cross section of the metal wiring 107 shown in FIG. 4B has a shape with curved side surfaces. Although not shown in the figure, the shape thereof may also be a trapezoid. In other words, the shape of the metal wiring 107 may have a trapezoidal cross section, and this trapezoidal shape may have its side surfaces curved.

In this case, a part having the same thickness exists at the center part of the cross-sectional shape of the metal wiring 107, and the more to the right or the left from the center part, the smaller the film thickness thereof becomes, gradually. In such a shape as well, since there are no sides parallel to the side of the reflection plate 106, it may make it possible to reduce the parasitic capacitance that appears between the reflection plate 106 and the metal wiring 107.

Furthermore, as shown in FIG. 4B, by providing the curved surfaces as the sides of the metal wiring 107, and by providing the curved surfaces with the shape which may allow the light transmitted through the silicon substrate 101 to be efficiently reflected to the photoelectric conversion part 102, it makes it possible to reflect the light being transmitted through the silicon substrate 101 to the photoelectric conversion part 102 with higher efficiency.

As described above, the shape of the metal wiring 107 may be any shape as long as it has a part having a varied film thickness. Hereinafter, further description will be given, by illustrating the metal wiring 107 having the first film thickness part 107b and the second film thickness part 107c as has been illustrated with reference to FIGS. 1, 2, 3A and 3B.

Figure 5:
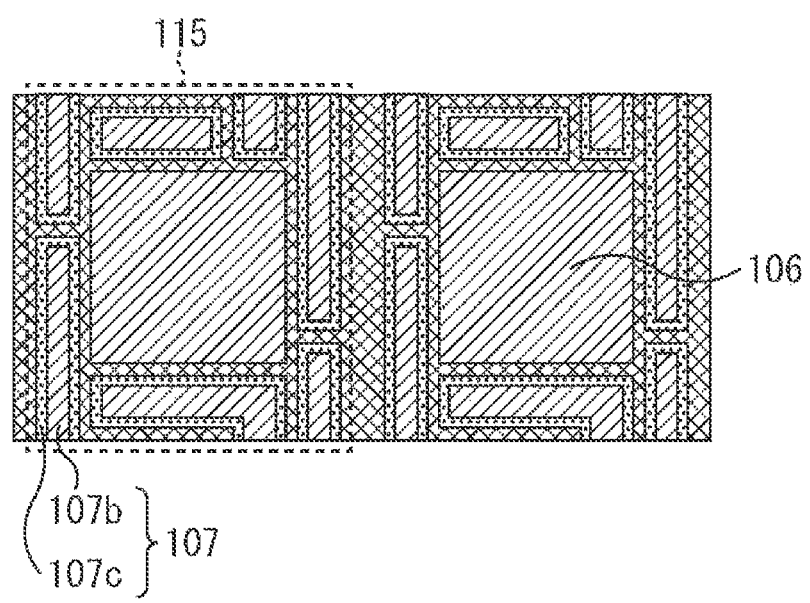
FIG. 5 is a plan view showing a configuration of a reflection portion of the imaging device of the first embodiment.

FIG. 5 is a plan view of the reflection portion of the imaging device when the pixel shown in FIG. 1 is viewed from the microlens 104 side (upper side). The reflection portion 115 shown in FIG. 5 has the metal wirings 107 existing around the reflection plate 106, which are placed in close proximity to the reflection plate 106 so that the space therebetween can inhibit passage of incident light. The reflection portion 115 is formed as an assembly of the reflection plate 106 and the metal wirings 107.

In other words, the reflection plate 106 and the metal wirings 107 are disposed in such a manner that a region where and the reflection plate 106 the metal wiring 107 are disposed adjacent to each other has a space narrower than a space that can inhibit passage of light having a wavelength detectable by the photoelectric conversion part 102. The reflection plate and the metal wirings are disposed also in the other embodiments which will be described later.

As has been described with reference to FIG. 2, the metal wiring 107 is made up of the first film thickness part 107b and the second film thickness part 107c. The second film thickness part 107c is thinner than the first film thickness part 107b. For example, the metal wiring 107 may include the first film thickness part 107b which has a film thickness of 200 nm, and the second film thickness part 107c which has a film thickness of 100 nm.

The film thickness of the second film thickness part 107c may be, for example, about 100 nm, from the viewpoint of thin-film limit in which EM (electromigration) resistance can be ensured and aggregation can be prevented in the metal wiring.

Referring to FIG. 5, a portion of the metal wiring 107 located in a region where two of the metal wirings 107 are disposed adjacent to each other, or in a region where the metal wiring 107 and the reflection plate 106 are disposed adjacent to each other, includes the second film thickness part 107c. That is, the metal wirings 107 and the reflection plate 106 are disposed in such a manner that, in the region where two metallic parts are disposed adjacent to each other, at least one of the metallic parts would be the second film thickness part 107c having the smaller film thickness. Therefore, as described above, it makes it possible to reduce the parasitic capacitance in the region where the adjacent metallic parts are located.

Thus, according to the imaging device of the first embodiment, the reflection portion 115 is formed as an assembly of the reflection plate 106 and the metal wirings 107. This may make it possible to make the size of the area of the reflection portion 115 larger and provide the imaging device having high sensitivity.

Further, by providing the metal wiring 107 with a relatively small film thickness (providing the second film thickness part 107c) in its part adjacent to the metal wiring 107 of an adjacent pattern thereto, it may prevent an increase in parasitic capacitance. Moreover, the metal wiring 107 is provided with a relatively large film thickness (provided with the first film thickness part 107b) in its part other than the part adjacent to the adjacent pattern thereto. This may make it possible to obtain a desired interconnect resistance and form the metal wirings with little signal propagation delay.

[Configuration of Imaging Device of Second Embodiment]

Figure 6A:
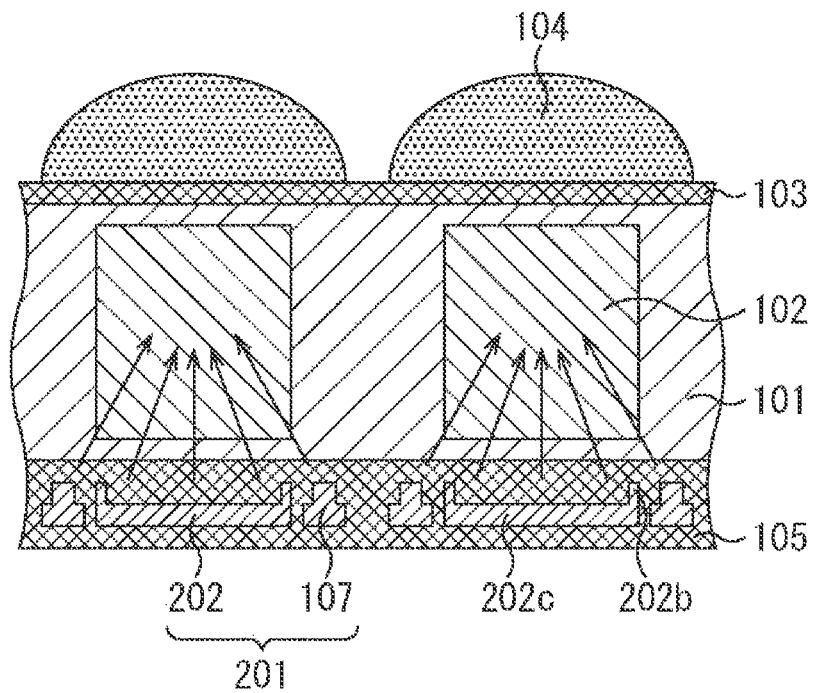
FIGS. 6A and 6B are figures showing a pixel structure of an imaging device of a second embodiment.
Figure 6B:
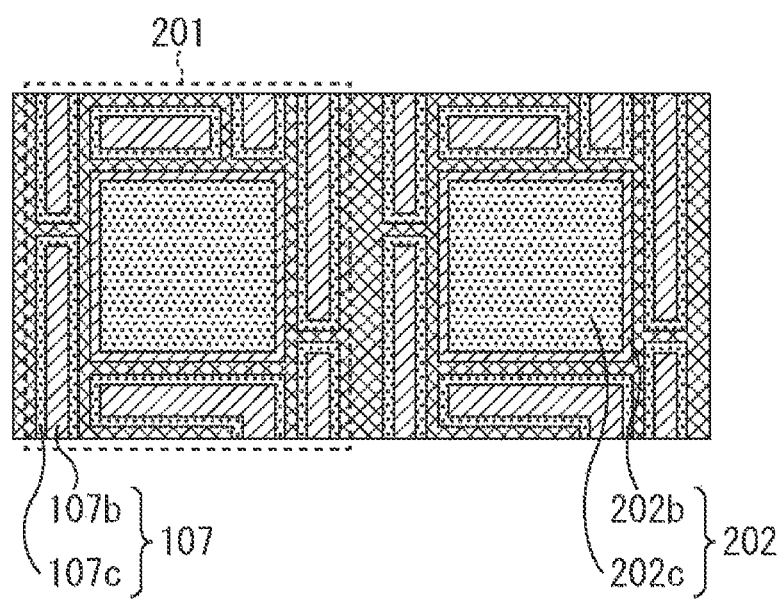

FIGS. 6A and 6B show a pixel structure according to a second embodiment. FIG. 6A is a cross-sectional view of the pixel structure. FIG. 6B is a plan view of the pixel structure as viewed from the upper side, and mainly shows a configuration of reflection portions. It should be noted that in the following descriptions, the components substantially the same as for the first embodiment (FIGS. 1 to 5) will be denoted by the same reference symbols and the description thereof will be omitted as appropriate.

In the pixel structure shown in FIG. 6A, some microlenses 104 are formed on an interlayer insulating film 103, over a silicon substrate 101 in which photoelectric conversion parts 102 are formed. This configuration is substantially the same as the pixel structure of the first embodiment shown in FIG. 1.

In a surface opposite to a light incidence surface, some reflection portions 201 are formed. Each of the reflection portions 201 is made up of metal wirings 107 and a reflection plate 202. The metal wirings 107 are used for reading signal charges and applying voltages to each part. This reflection plate 202 has a shape different from that of the reflection plate 106 of the first embodiment.

The metal wirings 107 may be formed separated from the reflection plate 202, by a space narrow enough so that passage therethrough of incident light would be inhibited. The metal wiring 107 has a relatively small film thickness in its part adjacent to the metal wiring 107 of an adjacent pattern thereto. Furthermore, the reflection plate 202 is provided with a relatively large film thickness in an edge part of its pattern and a relatively small film thickness in its part other than the edge part.

That is, the reflection plate 202 of the second embodiment has a part having a varied film thickness, similarly to the metal wiring 107. The reflection plate 202 includes a first film thickness part 202b having a larger film thickness and a second film thickness part 202c having a smaller film thickness. An edge part of the reflection plate 202 would be the first film thickness part 202b and a center part of the reflection plate 202 would be the second film thickness part 202c.

By thus forming the reflection plate 202 having a recessed shape, it makes it possible to allow the light transmitted through the silicon substrate 101 to be reflected by the reflection plate 202, and directed to the photoelectric conversion part 102, as described by the arrows in FIG. 6A. Accordingly, it makes it possible to reflect the light being transmitted through the silicon substrate 101 to the photoelectric conversion part 102 with higher efficiency.

In the plan view of the reflection portion 201 shown in FIG. 6B, the metal wirings 107 existing around the reflection plate 202 are placed in close proximity to the reflection plate 202, so that the space therebetween can inhibit passage of incident light. The reflection portion 201 is formed as an assembly of the reflection plate 202 and the metal wirings 107.

Similarly to the first embodiment, the metal wiring 107 is made up of the first film thickness part 107b and the second film thickness part 107c. The second film thickness part 107c is thinner than the first film thickness part 107b. In a region where two of the metal wirings 107 are disposed adjacent to each other, or in a region where the metal wiring 107 and the reflection plate 202 are disposed adjacent to each other, the second film thickness part 107c is located.

That is, the metal wirings 107 and the reflection plate 202 are disposed in such a manner that, in the region where two metallic parts are disposed adjacent to each other, at least one of the metallic parts would be the second film thickness part 107c having the smaller film thickness. Therefore, as described above, it makes it possible to reduce the parasitic capacitance in the region where the adjacent metallic parts are located.

In the second embodiment of the present disclosure, by forming the reflection plate 202 having a shape which is recessed with respect to the light incidence surface and has a relatively large thickness in its peripheral part, it makes it possible to allow the light transmitted through the silicon substrate 101 to be reflected by the reflection plate 202, and directed back toward the center of the photoelectric conversion part. This may make it possible to provide the imaging device having high sensitivity.

[Configuration of Imaging Device of Third Embodiment]

Figure 7A:
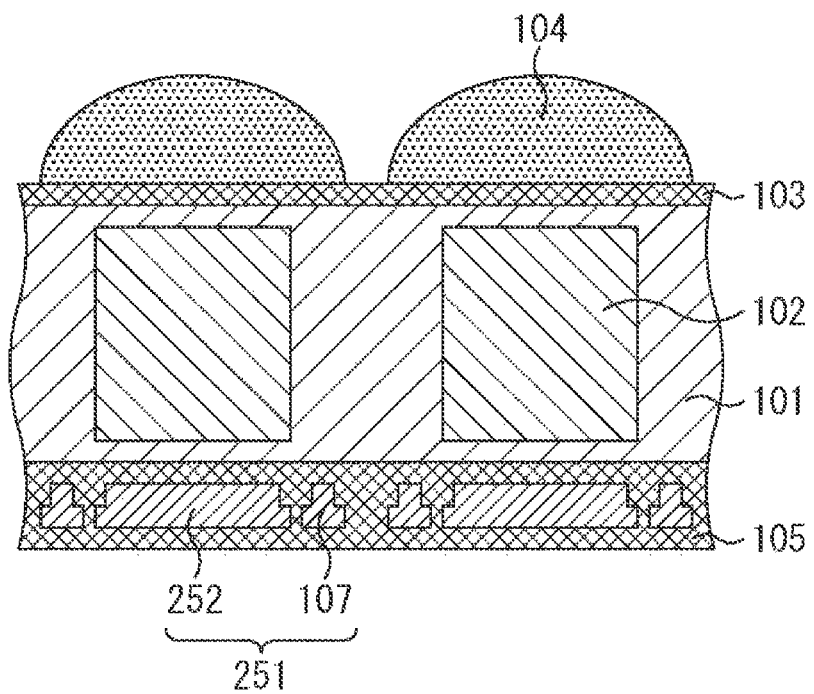
FIGS. 7A and 7B are figures showing a pixel structure of an imaging device of a third embodiment.
Figure 7B:
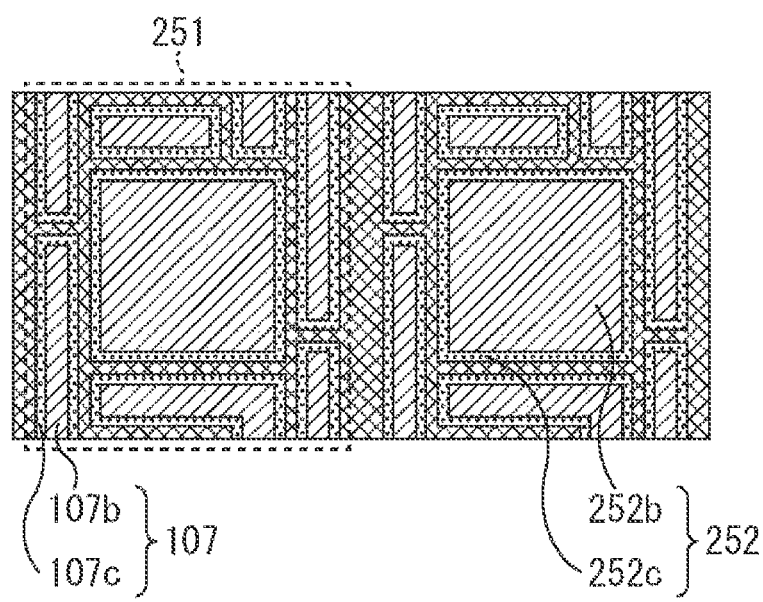

FIGS. 7A and 7B show a pixel structure according to a third embodiment. FIG. 7A is a cross-sectional view of the pixel structure. FIG. 7B is a plan view of the pixel structure as viewed from the upper side, and mainly shows a configuration of reflection portions.

The third embodiment has substantially the same configuration as the first and second embodiments, except that the shape of the reflection plate is replaced with a different one.

Each reflection portion 251 is made up of metal wirings 107 and a reflection plate 252. The reflection plate 252 is provided with a relatively large film thickness in an edge part of its pattern and a relatively small film thickness in its part other than the edge part. The reflection plate 252 has a shape similar to that of the metal wiring 107.

That is, the reflection plate 252 of the third embodiment has a part having a varied film thickness, similarly to the metal wiring 107. The reflection plate 252 includes a first film thickness part 252b having a larger film thickness and a second film thickness part 252c having a smaller film thickness. A center part of the reflection plate 252 would be the first film thickness part 252b and an edge part of the reflection plate 252 would be the second film thickness part 252c.

In the plan view of the reflection portion 251 shown in FIG. 7B, the metal wirings 107 existing around the reflection plate 252 are placed in close proximity to the reflection plate 252, so that the space therebetween can inhibit passage of incident light. The reflection portion 251 is formed as an assembly of the reflection plate 252 and the metal wirings 107.

Similarly to the first embodiment, the metal wiring 107 is made up of the first film thickness part 107b and the second film thickness part 107c. The second film thickness part 107c is thinner than the first film thickness part 107b. In a region where two of the metal wirings 107 are disposed adjacent to each other, two of the second film thickness parts 107c are located. In a region where the metal wiring 107 and the reflection plate 252 are disposed adjacent to each other, the second film thickness part 107c and the second film thickness part 252c are located.

That is, the metal wirings 107 and the reflection plate 252 are disposed in such a manner that, in the region where two metallic parts are disposed adjacent to each other, the metallic parts include at least one of the second film thickness part 107c and the second film thickness part 252c, each having the smaller film thickness. Therefore, as described above, it makes it possible to reduce the parasitic capacitance in the region where the adjacent metallic parts are located. In the third embodiment, since two metallic parts having a relatively small film thickness are disposed adjacent to each other in this region, the parasitic capacitance may be more reduced.

Thus, according to the imaging device of the third embodiment of the present disclosure, by providing the peripheral part of the reflection plate 252 with a relatively small film thickness, it may further reduce the capacitance between the reflection plate 252 and the metal wiring 107 adjacent thereto. This may make it possible to form the metal wirings with little signal propagation delay.

[Configuration of Imaging Device of Fourth Embodiment]

Figure 8A:
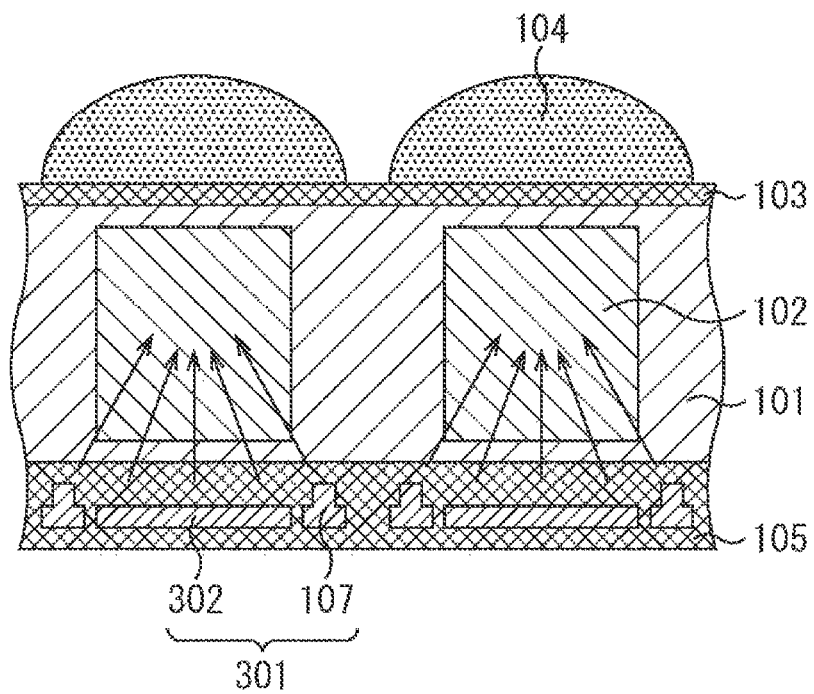
FIGS. 8A and 8B are figures showing a pixel structure of an imaging device of a fourth embodiment.
Figure 8B:
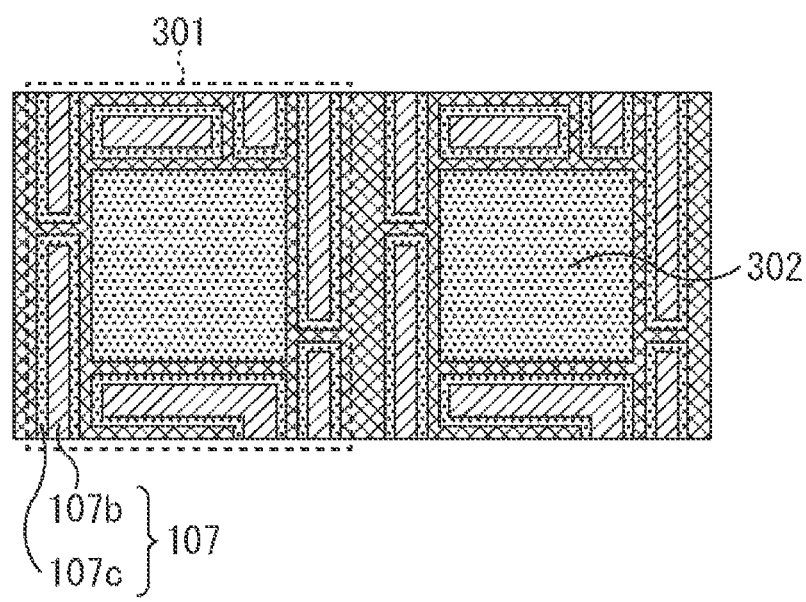

FIGS. 8A and 8B show a pixel structure according to a fourth embodiment. FIG. 8A is a cross-sectional view of the pixel structure. FIG. 8B is a plan view of the pixel structure as viewed from the upper side, and mainly shows a configuration of reflection portions.

The fourth embodiment has substantially the same configuration as the first to third embodiments, except that the shape of the reflection plate is replaced with a different one.

Each reflection portion 301 is made up of metal wirings 107 and a reflection plate 302. The reflection plate 302 has substantially the same film thickness over the entire structure thereof. The reflection plate 302 has substantially the same film thickness as that of the second film thickness part 107c, which is the smaller film thickness, of the metal wiring 107. Here, it can be described that the reflection plate 302 includes a second film thickness part 302c.

In the plan view of the reflection portion 301 shown in FIG. 8B, the metal wirings 107 existing around the reflection plate 302 are placed in close proximity to the reflection plate 302, so that the space therebetween can inhibit passage of incident light. The reflection portion 301 is formed as an assembly of the reflection plate 302 and the metal wirings 107.

Similarly to the first embodiment, the metal wiring 107 is made up of the first film thickness part 107b and the second film thickness part 107c. The second film thickness part 107c is thinner than the first film thickness part 107b. In a region where two of the metal wirings 107 are disposed adjacent to each other, two of the second film thickness parts 107c are located. In a region where the metal wiring 107 and the reflection plate 302 are disposed adjacent to each other, the second film thickness part 107c and the second film thickness part 302c are located.

That is, the metal wirings 107 and the reflection plate 302 are disposed in such a manner that, in the region where two metallic parts are disposed adjacent to each other, the metallic parts include at least one of the second film thickness part 107c and the second film thickness part 302c, each having the smaller film thickness. Therefore, as described above, it makes it possible to reduce the parasitic capacitance in the region where the adjacent metallic parts are located. In the fourth embodiment, since two metallic parts having a relatively small film thickness are disposed adjacent to each other in this region, the parasitic capacitance may be more reduced.

Thus, according to the imaging device of the fourth embodiment of the present disclosure, by providing the reflection plate 302 with a relatively small film thickness, it may further reduce the capacitance between the reflection plate 302 and the metal wiring 107 adjacent thereto. This may make it possible to form the metal wirings with little signal propagation delay.

Furthermore, in the fourth embodiment, regarding the overall structure of the reflection portion 301 formed by the metal wirings 107 and the reflection plate 302, a center part of the reflection portion 301 would be a part having the smaller film thickness, which part is formed by the second thickness part 302c of the reflection plate 302 and the second thickness parts 107c of the metal wirings 107. An edge part of the reflection portion 301 would be a part having the larger film thickness, which part is formed by the first thickness parts 107b of the metal wirings 107.

That is, the overall structure of the reflection portion 301 includes a center part having the smaller film thickness and an edge part having the larger film thickness. Accordingly, it makes it possible to allow the light transmitted through the silicon substrate 101 to be reflected by the reflection portion 301, and allow the reflected light to be collected in the center of the photoelectric conversion part 102, as shown in FIG. 8A. This may make it possible to provide the imaging device having high sensitivity characteristics.

[Configuration of Imaging Device of Fifth Embodiment]

Figure 9A:
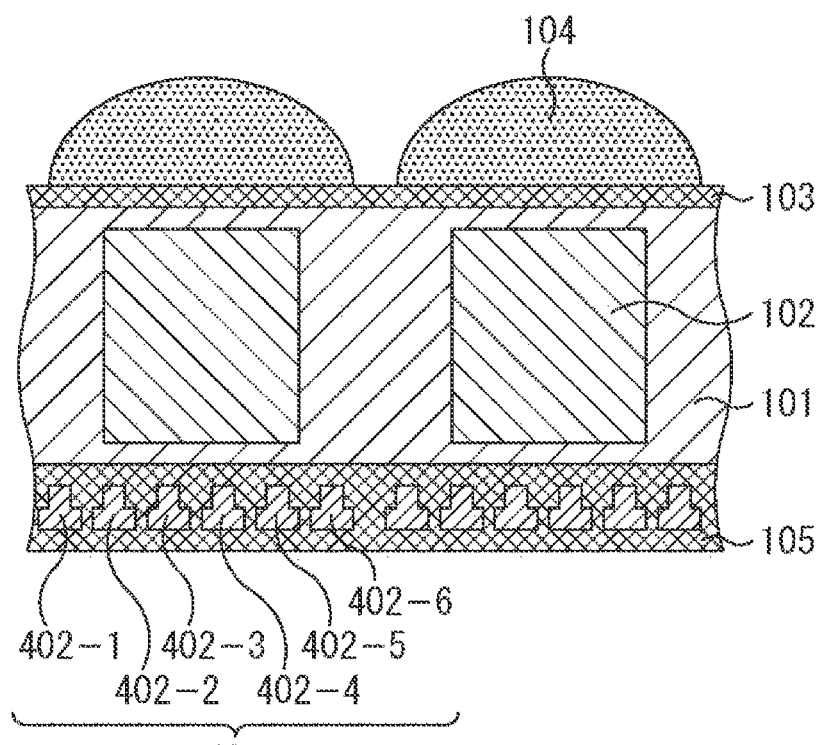
FIGS. 9A and 9B are figures showing a pixel structure of an imaging device of a fifth embodiment.
Figure 9B:
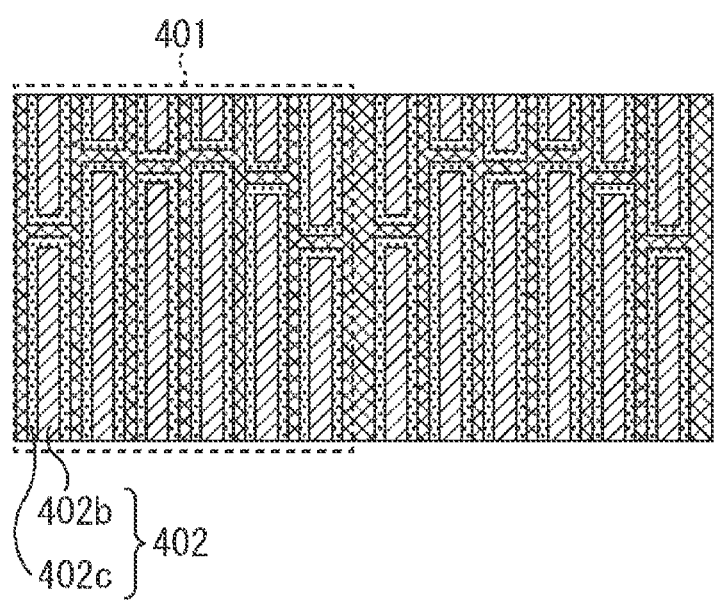

FIGS. 9A and 9B show a pixel structure according to a fifth embodiment. FIG. 9A is a cross-sectional view of the pixel structure. FIG. 9B is a plan view of the pixel structure as viewed from the upper side, and mainly shows a configuration of reflection portions.

The fifth embodiment has substantially the same configuration as the first to fourth embodiments, except that the reflection portions are made up of metal wirings.

Referring to FIG. 9A, each reflection portion 401 is made up of a plurality of metal wirings 402. In an example shown in FIG. 9A, the reflection portion 401 includes six metal wirings 402, which are metal wirings 402-1 to 402-6. Although the six metal wirings 402 are illustrated here as an example, it is also possible to modify the number of metal wirings 402.

A shape of each metal wiring 402 is the shape having varied film thicknesses as has been described for the first and other embodiments. A center part of the metal wiring 402 includes a first film thickness part 402b having a larger film thickness. An edge part thereof includes a second film thickness part 402c having a smaller film thickness.

The metal wirings 402 are formed separated from each other, by a space narrow enough so that passage therethrough of incident light would be inhibited. The metal wiring 402 has a relatively small film thickness in its part adjacent to the metal wiring 402 of an adjacent pattern thereto.

In the plan view of the reflection portion 401 shown in FIG. 9B, the metal wirings 402 which also function as the reflection portion 401 are placed in close proximity to each other, so that the space therebetween can inhibit passage of incident light. The reflection portion 401 is formed as an assembly of the metal wirings 402.

Similarly to the first embodiment, the metal wiring 402 is made up of the first film thickness part 402b and the second film thickness part 402c. The second film thickness part 402c is thinner than the first film thickness part 402b. In a region where two of the metal wirings 402 are disposed adjacent to each other, two of the second film thickness parts 402c are located.

That is, the metal wirings 402 are disposed in such a manner that, in the region where two metallic parts are disposed adjacent to each other, the metallic parts would be the second film thickness parts 402c each having the smaller film thickness. Therefore, as described above, it makes it possible to reduce the parasitic capacitance in the region where the adjacent metallic parts are located. In the fifth embodiment, since two metallic parts having a relatively small film thickness are disposed adjacent to each other in this region, the parasitic capacitance may be more reduced.

Thus, according to the imaging device of the fifth embodiment of the present disclosure, the reflection portion 401 can be formed as an assembly of a metal wiring layer, and can reduce the capacitance between adjacent wirings. This may make it possible to form the metal wirings 402 with little signal propagation delay, while achieving an effect of increasing sensitivity by the reflection portion 401.

Furthermore, since every metal pattern is formed to be used also as a wiring, instead of a reflection plate for the sole purpose of providing a reflecting function, it may have a higher degree of freedom of wiring layout.

Incidentally, in a layout of the reflection portion 401 in the plan view shown in FIG. 9B, the wirings are arranged along a vertical direction of the figure. However, other layouts are also possible as a matter of course, and the wirings may be laid-out in any direction; for example, a right-and-left direction of the figure.

As shown in FIG. 9A, the reflection portion 401 has been described as one made up of the metal wirings 402-1 to 402-6. All of the metal wirings 402-1 to 402-6 may be used as the wirings. Alternatively, a configuration in which some of the metal wirings 402-1 to 402-6 may be used as the wirings and the rest of them may be used as the reflection plate is possible.

[Configuration of Imaging Device of Sixth Embodiment]

Figure 10A:
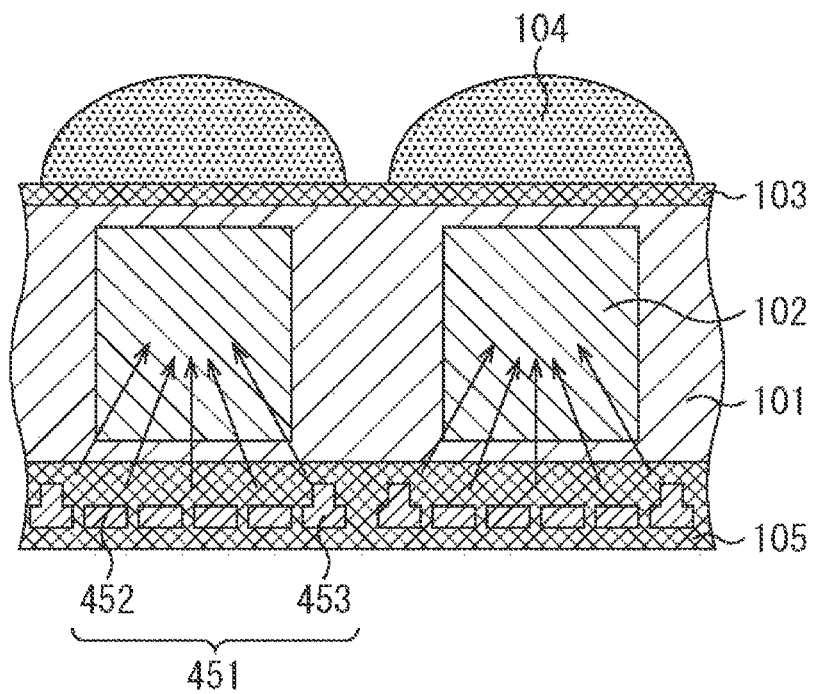
FIGS. 10A and 10B are figures showing a pixel structure of an imaging device of a sixth embodiment.
Figure 10B:
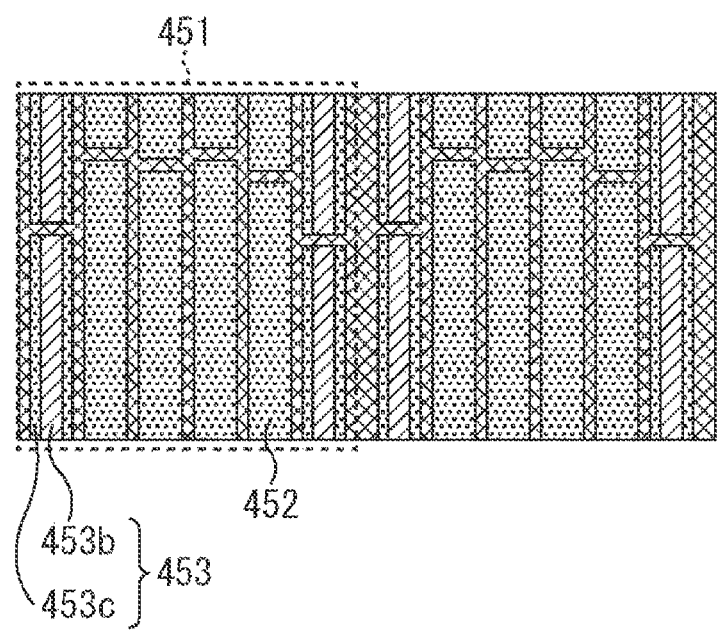

FIGS. 10A and 10B show a pixel structure according to a sixth embodiment. FIG. 10A is a cross-sectional view of the pixel structure. FIG. 10B is a plan view of the pixel structure as viewed from the upper side, and mainly shows a configuration of reflection portions.

The sixth embodiment has substantially the same configuration as the first to fourth embodiments, except that the reflection portions are made up of metal wirings.

Referring to FIG. 10A, each reflection portion 451 is made up of metal wirings 452 and metal wirings 453. As shown in FIG. 10A, four metal wirings 452 are located at a center of the corresponding reflection portion 451, and the metal wirings 453 are located at right and left ends of the reflection portion 451. In the example shown in FIG. 10A, the reflection portion 451 includes six metal wirings.

A shape of each metal wiring 453 located at the end of the reflection portion 451 is the shape having varied film thicknesses as has been described for the first and other embodiments. A center part of the metal wiring 453 includes a first film thickness part 453b having a larger film thickness. An edge part thereof includes a second film thickness part 453c having a smaller film thickness.

A shape of each metal wiring 452 located at a center of the reflection portion 451 has a substantially uniform film thickness, which is substantially the same film thickness as that of the second film thickness part 453c of the metal wiring 453. The metal wirings 452 and 453 which make up the reflection portion 451 are formed separated from each other, by a space narrow enough so that passage therethrough of incident light would be inhibited. The metal wirings 452 and 453 have a relatively small film thickness in their part adjacent to any of the metal wirings 452 and 453 of an adjacent pattern thereto.

In the plan view of the reflection portion 451 shown in FIG. 10B, the metal wirings 452 and 453 which also function as the reflection portion 451 are placed in close proximity to each other, so that the space therebetween can inhibit passage of incident light. The reflection portion 451 is formed as an assembly of the metal wirings 452 and 453.

The metal wirings 452 and 453 are disposed in such a manner that, in the region of the reflection portion 451 where two metallic parts are disposed adjacent to each other, the metallic parts include at least one of a second film thickness part 452c of the metal wiring 452 and the second film thickness part 453c of the metal wiring 453, each having the smaller film thickness. Therefore, as described above, it makes it possible to reduce the parasitic capacitance in the region where the adjacent metallic parts are located. In the sixth embodiment, since two metallic parts having a relatively small film thickness are disposed adjacent to each other in this region, the parasitic capacitance may be more reduced.

Thus, according to the sixth embodiment of the present disclosure, the reflection portion 451 can be formed as an assembly of a metal wiring layer, and can reduce the capacitance between adjacent wirings. This may make it possible to form the metal wirings 452 and 453 with little signal propagation delay, while achieving an effect of increasing sensitivity by the reflection portion 451.

Furthermore, since every metal pattern is formed to be used also as a wiring, instead of a reflection plate for the sole purpose of providing a reflecting function, it may have a higher degree of freedom of wiring layout.

Moreover, in the sixth embodiment, regarding the overall structure of the reflection portion 451 formed by the metal wirings 452 and 453, a center part of the reflection portion 451 would be a part having the smaller film thickness, which part is formed by the second thickness parts 452c of the metal wirings 452 and the second thickness parts 453c of the metal wirings 453. An edge part of the reflection portion 451 would be a part having the larger film thickness, which part is formed by the first thickness parts 453b of the metal wirings 453.

That is, the overall structure of the reflection portion 451 includes a center part having the smaller film thickness and an edge part having the larger film thickness. Accordingly, it makes it possible to allow the light transmitted through the silicon substrate 101 to be reflected by the reflection portion 451, and allow the reflected light to be collected in the center of the photoelectric conversion part 102, as shown in FIG. 10A. This may make it possible to provide the imaging device having high sensitivity characteristics.

[Configuration of Imaging Device of Seventh Embodiment]

Figure 11A:
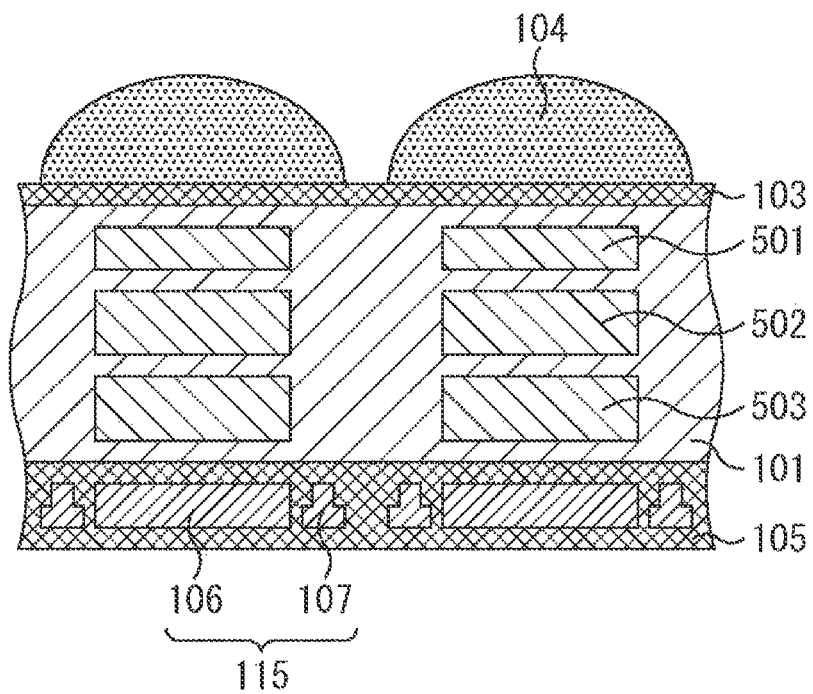
FIGS. 11A and 11B are figures showing a pixel structure of an imaging device of a seventh embodiment.
Figure 11B:
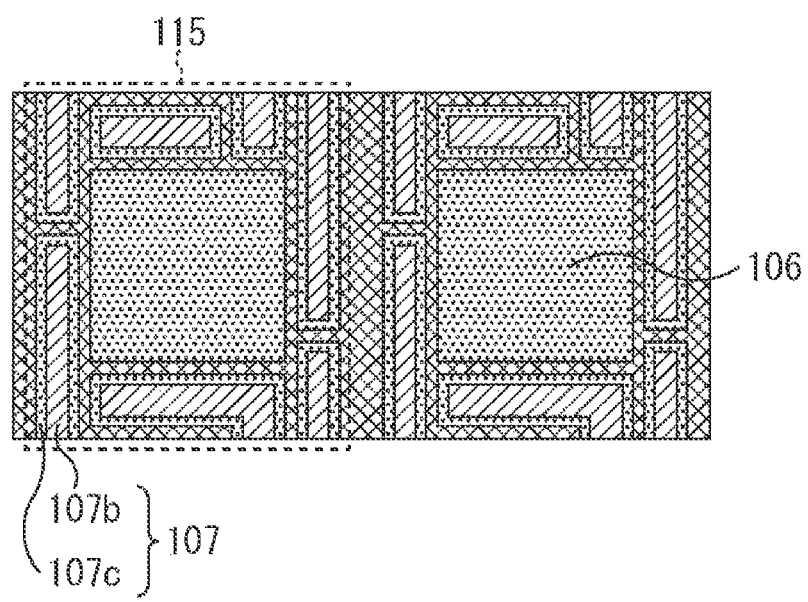

FIGS. 11A and 11B show a pixel structure according to a seventh embodiment. FIG. 11A is a cross-sectional view of the pixel structure. FIG. 11B is a plan view of the pixel structure as viewed from the upper side, and mainly shows a configuration of reflection portions.

The seventh embodiment has substantially the same configuration as the first to sixth embodiments, except that the configuration of the photoelectric conversion parts is replaced with a different one.

Each photoelectric conversion part in the pixel structure shown in FIG. 11A includes a first photoelectric conversion part 501, a second photoelectric conversion part 502 and a third photoelectric conversion part 503 being laminated in a single pixel region. Some microlenses 104 are formed on an interlayer insulating film 103, over a silicon substrate 101 in which the photoelectric conversion parts having these three layers of photoelectric conversion parts are formed.

Further, in a surface opposite to a light incidence surface, some reflection portions 115 are formed. Each of the reflection portions 115 is made up of metal wirings 107 and a reflection plate 106. The metal wirings 107 are used for reading signal charges and applying voltages to each part. Since this configuration is substantially the same as in the first embodiment, the description thereof will be omitted. FIG. 11B is a plan view of the reflection portions of the imaging device according to the seventh embodiment. Since this figure is substantially the same as that for the first embodiment, the description thereof will be omitted.

Here, the configuration of the reflection portions 115 is illustrated by an example employing the configuration that has been described as the first embodiment. Any of the second to sixth embodiments may be employed as well. In other words, an embodiment may have a configuration in which the configuration of the first photoelectric conversion part 501, the second photoelectric conversion part 502 and the third photoelectric conversion part 503 being laminated in a single pixel region is combined with a configuration of the reflection portions according to any of the first to sixth embodiments.

In the imaging device according to the seventh embodiment, the photoelectric conversion part has a laminated structure of the first photoelectric conversion part 501, the second photoelectric conversion part 502 and the third photoelectric conversion part 503, and these photoelectric conversion parts may produce an output by photoelectrically converting light having a wavelength of a corresponding wavelength region assigned to each of the photoelectric conversion parts.

The deeper the position of the photoelectric conversion part is as seen from the light incidence surface, the longer-wavelength region the wavelength region detectable by the photoelectric conversion part may become. Accordingly, the light that does not undergo photoelectric conversion by the third photoelectric conversion part 503 for detecting the longest wavelength light may be reflected by the reflection portion 115, to enter the third photoelectric conversion part 503 again.

The reflection of light by the reflection portion 115 may be effective especially for long-wavelength light.

By applying this feature to the imaging device having a laminated photoelectric conversion part as shown in FIG. 11A, it may allow enhancement of the sensitivity characteristics of the photoelectric conversion part, especially, of one formed at the deepest position in the substrate.

In a region where the reflection plate 106 and the metal wiring 107 are disposed adjacent to each other, and in a region where two of the metal wirings 107 are disposed adjacent to each other, a space separating the metal wiring 107 from the reflection plate 106 or another metal wiring 107 is set narrower than a space that can inhibit passage of light having a wavelength detectable by the photoelectric conversion part that is closest to the reflection portion 115 (shown as the third photoelectric conversion part 503 in FIG. 11A) among the plurality of photoelectric conversion parts being laminated. Such a narrow space may make it possible to allow the light transmitted through the silicon substrate 101 to be reflected by the reflection portion 115 with little loss.

Thus, the present disclosure may also be applied to imaging devices having a laminated photoelectric conversion part. This may allow enhancement of the sensitivity characteristics of the imaging device having the laminated photoelectric conversion part.

Incidentally, this embodiment has been illustrated by an example employing the structure in which three layers of photoelectric conversion parts are laminated. However, the number of the laminated layers of the photoelectric conversion part is not limited to three.

[Configuration of Imaging Device of Eighth Embodiment]

In one imaging device, any of the reflection portions described in the first to sixth embodiments may be used in combination. For example, it is also possible to employ reflection portions each having a different structure depending on their position in an image region.

Figure 12:
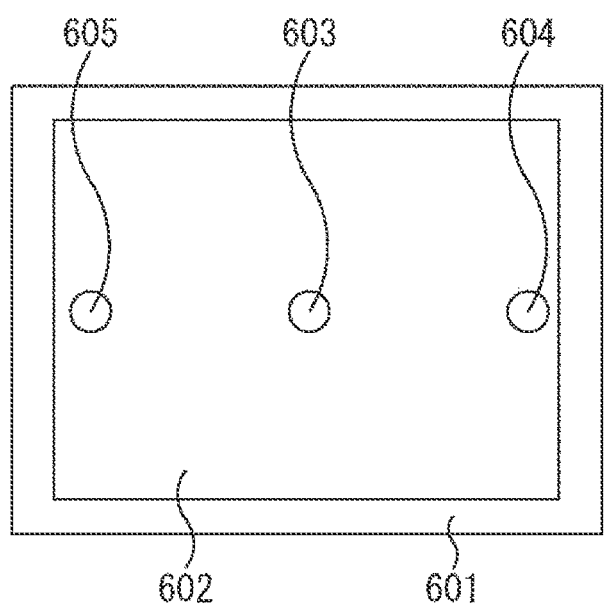
FIG. 12 is a figure showing a chip layout of an imaging device of an eighth embodiment.

FIG. 12 is a plan view showing a chip layout of an imaging device having reflection portions according to an eighth embodiment. In the chip layout shown in FIG. 12, an image region 602 is arranged in an imaging device 601.

In the image region 602, pixels are arranged in a matrix.

Among the pixels arranged in the image region 602, center pixels 603 located at the center of the image region 602, right end pixels 604 located at the right end of the image region 602, and left end pixels 605 located at the left end of the image region 602 are each provided with reflection portions having a corresponding configuration with a different structure depending on the position. Regarding these pixels, mainly, the configuration of the reflection portions will be described with reference to FIGS. 13A to 15B.

Figure 13A:
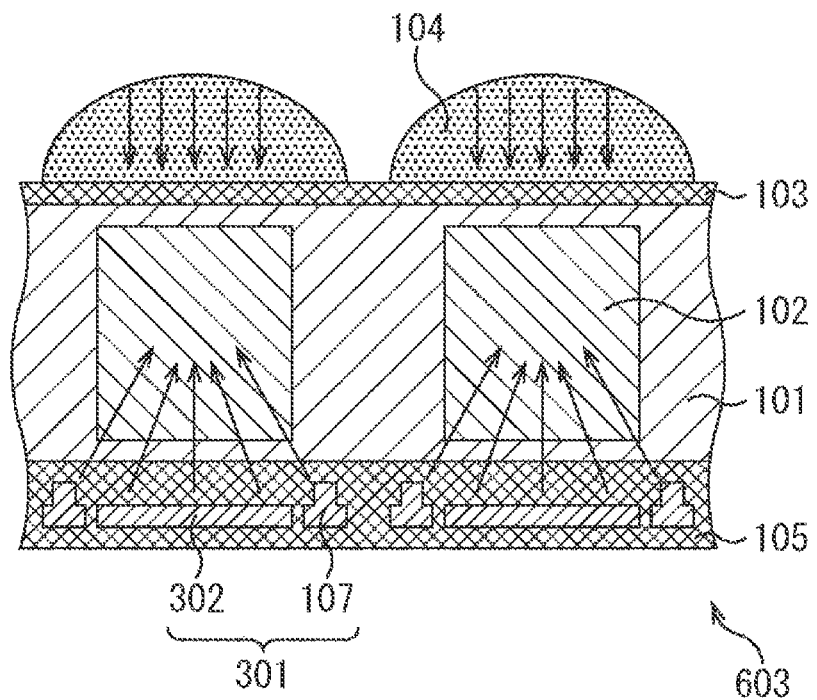
FIGS. 13A and 13B are figures showing a pixel structure of an imaging device of the eighth embodiment.
Figure 13B:
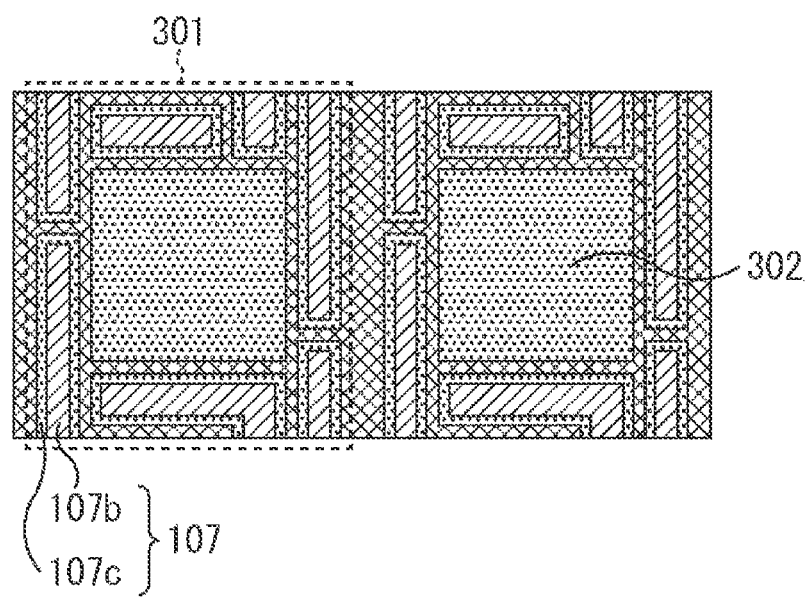

FIGS. 13A and 13B show a pixel structure of the center pixels 603 of the eighth embodiment. FIG. 13A is a cross-sectional view of the pixel structure. FIG. 13B is a plan view of the pixel structure as viewed from the upper side, and mainly shows a configuration of reflection portions.

The reflection portions 301 shown in FIGS. 13A and 13B have substantially the same configuration as the reflection portions 301 that have been shown in FIGS. 8A and 8B for the fourth embodiment. That is, the reflection portion 301 is made up of the reflection plate 302 and the metal wirings 107. The reflection plate 302 has substantially the same film thickness as that of an edge part of the metal wiring 107, which is the smaller film thickness. A shape of the metal wiring 107 is the shape having the first film thickness part 107b and the second film thickness part 107c.

Since the reflection portions 301 formed in such a shape have already been described with reference to FIGS. 8A and 8B, a description thereof in detail will be omitted. As shown in FIG. 13A, the reflection portions 301 located at the center pixels 603 may have a configuration suitable for efficiently reflecting the light being incident vertically on an imaging surface to the photoelectric conversion part 102.

Although a case of employing the reflection portions 301 that have been described for the fourth embodiment is illustrated here as an example, it is also possible to employ the reflection portions of the other embodiments.

Figure 14A:
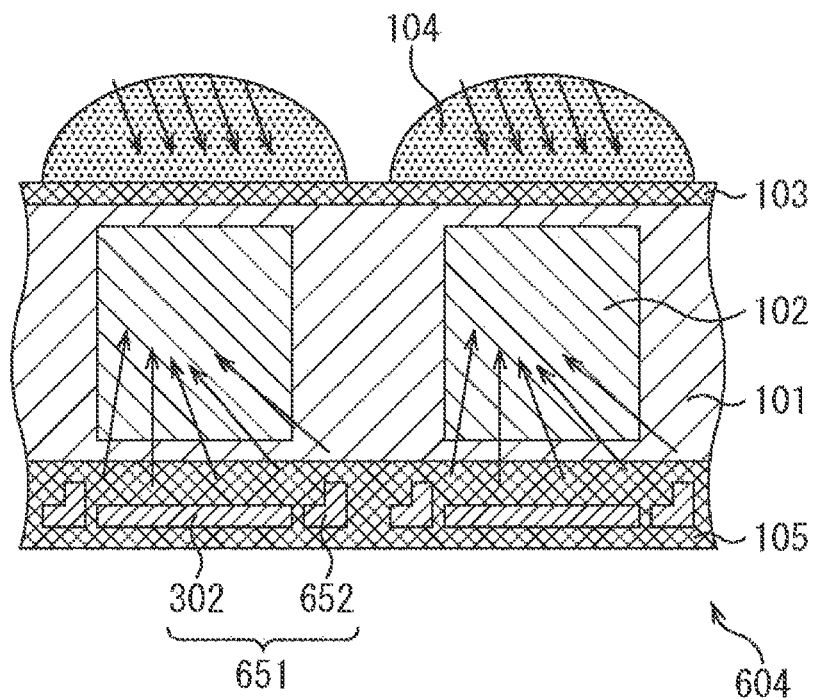
FIGS. 14A and 14B are figures showing another pixel structure of an imaging device of the eighth embodiment.
Figure 14B:
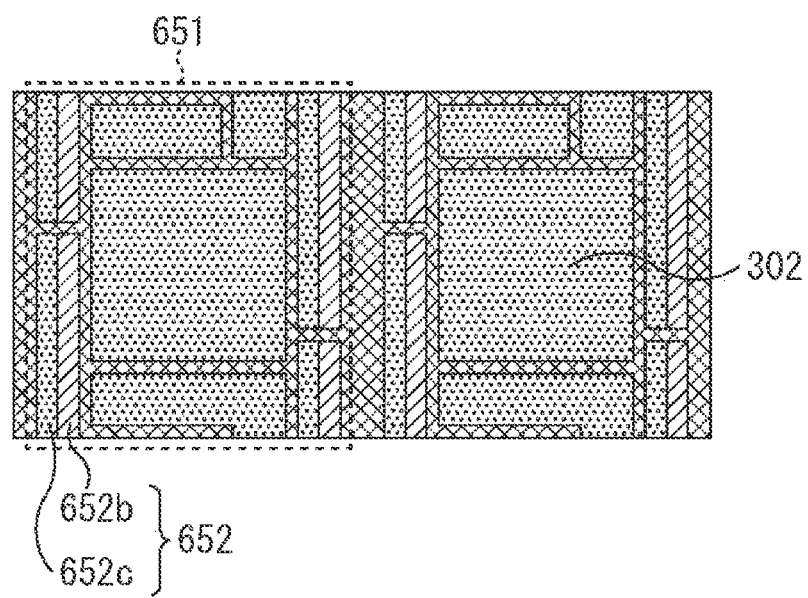

FIGS. 14A and 14B show a pixel structure of the right end pixels 604 of the eighth embodiment. FIG. 14A is a cross-sectional view of the pixel structure. FIG. 14B is a plan view of the pixel structure as viewed from the upper side, and mainly shows a configuration of reflection portions.

In the pixel structure shown in FIGS. 14A and 14B, each reflection portion 651 is made up of the reflection plate 302 and metal wirings 652. Similarly to the reflection plate 302 of the center pixel 603 shown in FIGS. 13A and 13B, the reflection plate 302 is made up of the second film thickness part 302c having the smaller film thickness.

A shape of the metal wiring 652 is the shape having varied film thicknesses, similarly to the metal wiring 107 of the center pixel 603 shown in FIGS. 13A and 13B. However, the shape of the metal wiring 652 has its one edge at the left side in the figure formed by a second film thickness part 652c having the smaller film thickness; which is different from the metal wiring 107 that has its both edge parts each formed by the second film thickness part 107c having the smaller film thickness.

The metal wiring 652 of the right end pixel 604 shown in FIG. 14A has a right part in the figure formed by a first film thickness part 652b having the larger film thickness; and a left part in the figure formed by the second film thickness part 652c having the smaller film thickness.

As shown in FIG. 14A, the reflection portions 651 located at the right end pixels 604 may have a configuration suitable for efficiently reflecting the light being incident from a left oblique direction on the right end pixels 604 to the photoelectric conversion part 102.

When the reflection portions 651 are configured in such a manner, since the reflection plates 302 are made up of the second film thickness parts 302c having the smaller film thickness, a part thereof which is adjacent to the metal wiring 652 would be an adjacent second film thickness part 302c thereto. As a result, similarly to the above-mentioned embodiments, it may make it possible to reduce the capacitance between the metal wiring 652 and the reflection plate 302 which are adjacent to each other.

Further, in the region where two metal wirings 652 are disposed adjacent to each other, the first film thickness part 652b and the second film thickness part 652c would be adjacent to each other. This may make it possible to reduce the capacitance between the metal wirings 652 which are adjacent to each other.

Figure 15A:
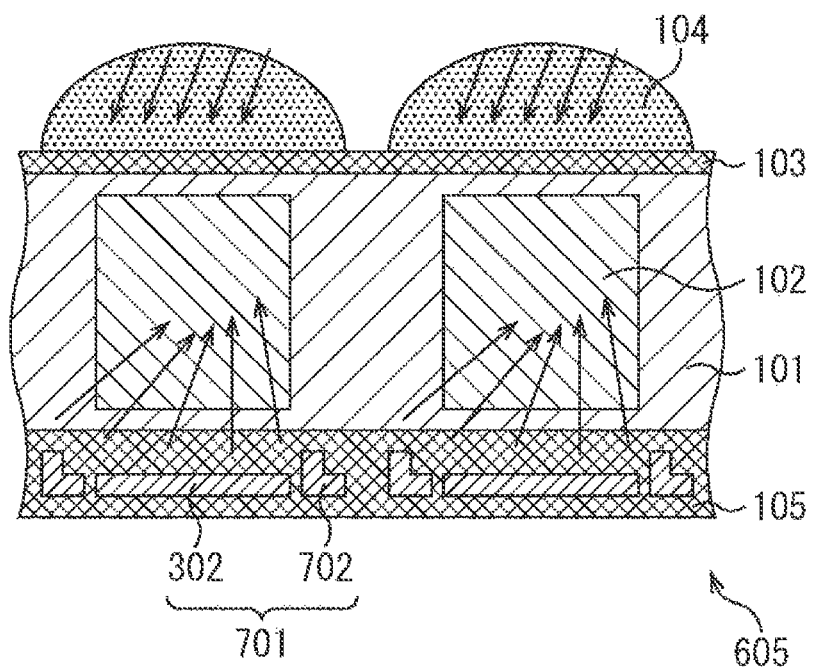
FIGS. 15A and 15B are figures showing still another pixel structure of an imaging device of the eighth embodiment.
Figure 15B:
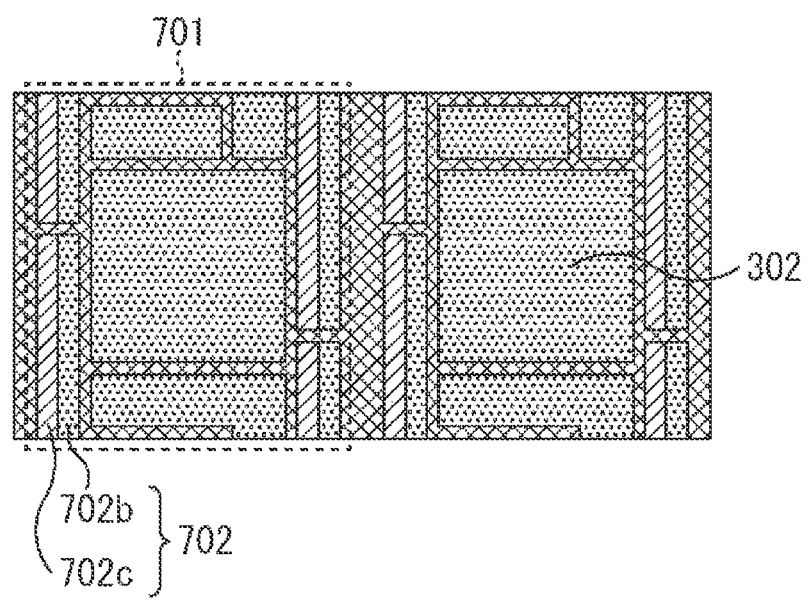

FIGS. 15A and 15B show a pixel structure of the left end pixels 605 of the eighth embodiment. FIG. 15A is a cross-sectional view of the pixel structure. FIG. 15B is a plan view of the pixel structure as viewed from the upper side, and mainly shows a configuration of reflection portions.

In the pixel structure shown in FIGS. 15A and 15B, each reflection portion 701 is made up of the reflection plate 302 and metal wirings 702. Similarly to the reflection plate 302 of the center pixel 603 shown in FIGS. 13A and 13B, the reflection plate 302 is made up of the second film thickness part 302c having the smaller film thickness.

A shape of the metal wiring 702 is the shape having varied film thicknesses, similarly to the metal wiring 107 of the center pixel 603 shown in FIGS. 13A and 13B. However, the shape of the metal wiring 702 has its one edge at the right side in the figure formed by a second film thickness part 702c having the smaller film thickness; which is different from the metal wiring 107 that has its both edge parts each formed by the second film thickness part 107c having the smaller film thickness.

The metal wiring 702 of the left end pixel 605 shown in FIG. 15A has a left part in the figure formed by a first film thickness part 702b having the larger film thickness; and a right part in the figure formed by the second film thickness part 702c having the smaller film thickness.

As shown in FIG. 15A, the reflection portions 701 located at the left end pixels 605 may have a configuration suitable for efficiently reflecting the light being incident from a right oblique direction on the left end pixels 605 to the photoelectric conversion part 102.

When the reflection portions 701 are configured in such a manner, since the reflection plates 302 are made up of the second film thickness parts 302c having the smaller film thickness, a part thereof which is adjacent to the metal wiring 702 would be an adjacent second film thickness part 302c thereto. As a result, similarly to the above-mentioned embodiments, it may make it possible to reduce the capacitance between the metal wiring 702 and the reflection plate 302 which are adjacent to each other.

Further, in the region where two metal wirings 702 are disposed adjacent to each other, the first film thickness part 702b and the second film thickness part 702c would be adjacent to each other. This may make it possible to reduce the capacitance between the metal wirings 702 which are adjacent to each other.

The imaging device according to the eighth embodiment of the present disclosure may allow the reflected light to be collected in different directions by allowing the metal wirings that make up the reflection portions to have a different shape depending on the position of corresponding pixels in the image region 602.

This, for example, makes it possible to correct a reflection direction of the reflected light to be directed toward the center of the photoelectric conversion part 102, even in cases where the incidence angle of the light is different depending on the position of the pixel in the image region 602.

[Process of Production of Imaging Device]

Next, a process of production of the imaging devices of the first to eighth embodiments will be described. Here, a description will be given by illustrating a process of production of the imaging device of the first embodiment. The imaging devices of the second to eighth embodiments are also able to be produced by basically similar processes to that for the first embodiment, and the description thereof will be omitted.

FIGS. 16 to 19 are figures for illustrating a process of the production of the imaging device of the first embodiment. The figures are cross-sectional diagrams of the process of producing an imaging device performed in sequence.

Figure 16:
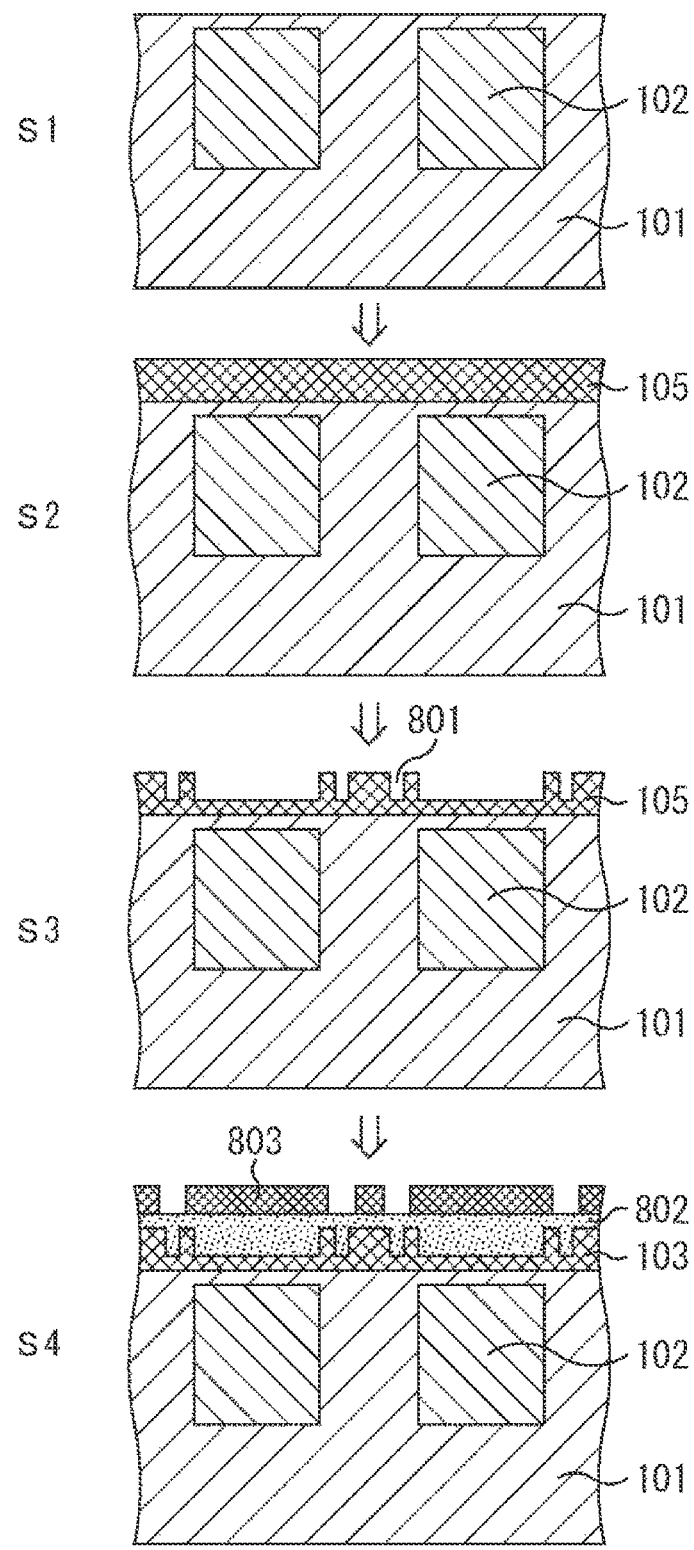
FIG. 16 is a figure showing a process of the production of an imaging device.

As shown in FIG. 16, in the step S1, the photoelectric conversion parts 102 are formed in the silicon substrate 101. Although not shown in FIG. 16, the step S1 may also include forming, in addition to the photoelectric conversion parts 102, other parts such as element isolating regions for electrically isolating each of the photoelectric conversion parts 102, transistors configuring a read circuit for reading signal charges, and diffusion layer for storing signal charges.

Incidentally, in a case where the imaging device having the first to third photoelectric conversion parts 501 to 503 being laminated as shown in FIGS. 11A and 11B is to be produced, each of the first to third photoelectric conversion parts 501 to 503 may be formed in the silicon substrate 101 in the step S1.

In the step S2, the insulating film 105 is formed on the silicon substrate 101. After the formation of the insulating film 105, in the step S3, first wiring recesses 801 are formed to the insulating film 105. The first wiring recess 801 is a recess which is for forming the first film thickness part 107b of the metal wiring 107. In addition, in the step S3, other recesses which are for forming the reflection plates 106 are also formed.

Next, in the step S4, in an entire surface of the device, a layer of planarization material 802 is formed to fill the first wiring recesses 801 and to planarize the surface. On the planarized layer of the planarization material 802, photoresists 803 are formed. The photoresists 803 are formed in regions other than regions where the second film-thickness parts of the metal wirings 107 are intended to be formed.

Figure 17:
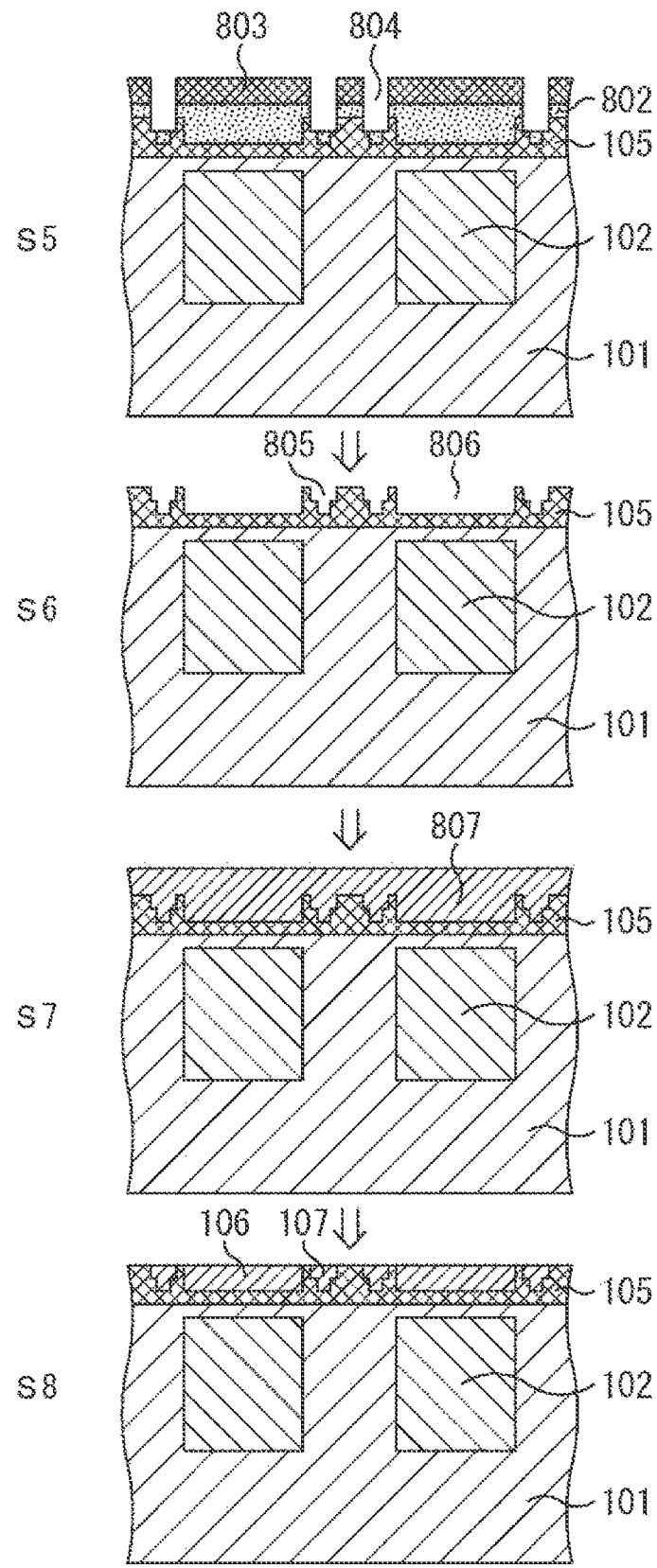
FIG. 17 is a figure showing a process of the production of the imaging device.

Then, in the step S5 shown in FIG. 17, by an etching process performed using the photoresists 803 as a mask, the planarization material 802 and the insulating film 105 in predetermined regions are removed, to form second wiring recesses 804. The second wiring recess 804 is a recess which is for forming the second film thickness part 107c of the metal wiring 107.

In the step S6, the photoresists 803 and the planarization material 802 are removed, to form wiring recesses 805 each having varied depths and reflection-plate recesses 806 each having a uniform depth. The wiring recess 805 is a recess in which the metal wiring 107 is to be formed. The reflection-plate recess 806 is a recess in which the reflection plate 106 is to be formed.

In the step S7, in an entire surface of the device, a metallic material film 807 is formed. In such a manner, the reflection portions 115 may be each formed as a metallic material film by damascene method.

For example, the metallic material film 807 may be copper deposited by plating. Before depositing the copper by plating, a tantalum film which serves as a barrier metal; and copper which serves as a seed film for plating may be deposited by sputtering in advance (not shown). Thus, examples of the metallic material film 807 include copper and a copper alloy.

In the step S8, chemical mechanical polishing (CMP method) may be performed, to remove the metallic material film 807 except that formed in the wiring recesses 805 and the reflection-plate recesses 806 and form the reflection plates 106 and the metal wirings 107.

The reflection plates 106 and the metal wirings 107 are thus formed. In cases where the reflection plates and the metal wirings of any of the second to eighth embodiments are to be produced, the first wiring recesses 801 and the second wiring recesses 804 having the shapes matching to the shapes of the reflection plates and the metal wirings may be formed.

Figure 18:
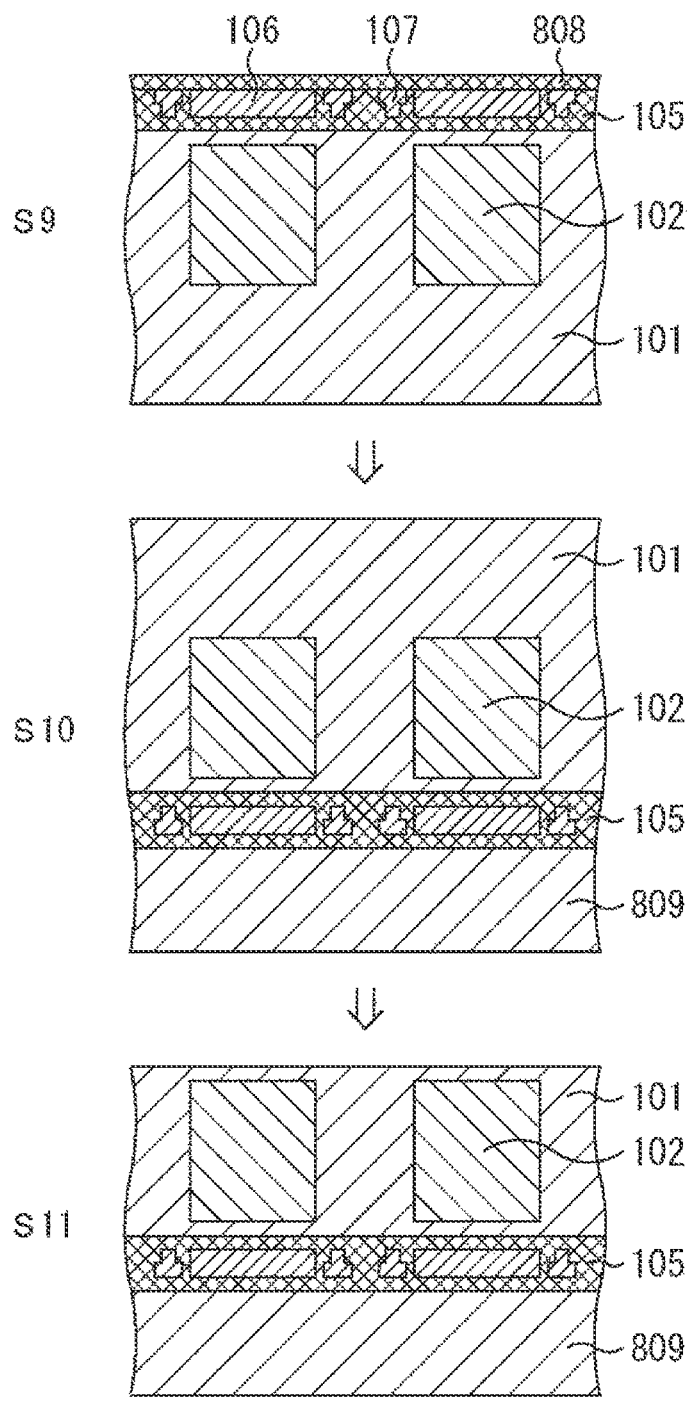
FIG. 18 is a figure showing a process of the production of the imaging device.

In the step S9 shown in FIG. 18, in an entire surface of the device, an insulating film 808 is formed. The reflection plates 106 and the metal wirings 107 would be enclosed by the insulating film 105 having already been formed and the insulating film 808 being formed in this step.

In the step S10, the substrate is inverted; and a support substrate 809 is stuck to the surface of the device on the side at which the reflection plates 106 and the metal wirings 107 have been formed. Subsequently, in the step S11, the silicon substrate 101 is thinned, so that the position of the photoelectric conversion parts 102 would be in the vicinity of a surface of the silicon substrate.

Figure 19:
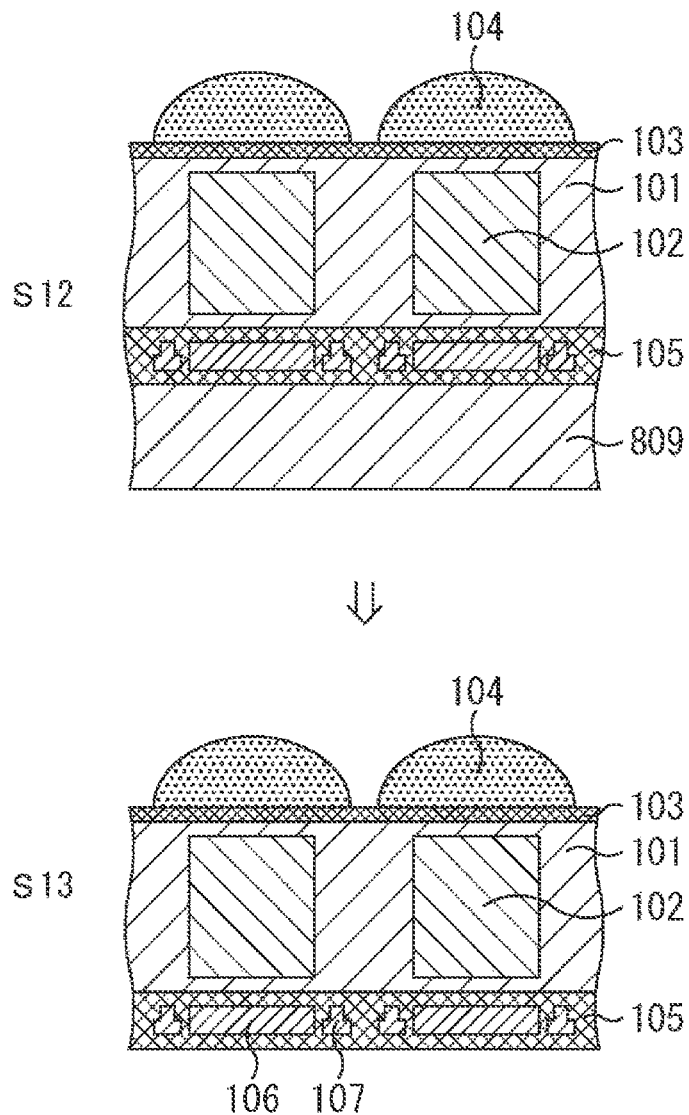
FIG. 19 is a figure showing a process of the production of the imaging device.

In the step S12 shown in FIG. 19, the interlayer insulating film 103 and the microlenses 104 are formed. Then, in the step S13, the support substrate 809 is removed; for example, by grinding.

Thus, the imaging device according to the embodiment would be produced.

By such a production method, it makes it possible to form the imaging device having the reflection portion 115 formed as an assembly of the reflection plate 106 and the metal wirings 107, with each of the metal wirings 107 having the first film thickness part 107b and the second film thickness part 107c.

In the production method of this embodiment, the formation of the wiring recesses for forming the metal wirings 107 having varied film thicknesses, the second wiring recesses 804 have been patterned after the formation of the first wiring recesses 801 in such a manner that the second wiring recesses 804 would cover the regions of the first wiring recesses 801, which first wiring recesses 801 correspond to parts having the larger film thickness. However, instead of this, it is also possible to first form the second wiring recesses 804, and then form the first wiring recesses 801 within predetermined regions of the second wiring recesses 804, to form the metal wirings 107 having varied film thicknesses.

It should be noted that although the metallic material film that makes up the reflection portion has been illustrated in the figures as a single layer of metallic material, each of the above-mentioned embodiments may also be applied to any one of a plurality of metallic material layers in a case where the reflection portion includes a plurality of metal wiring layers. In other words, in cases where a plurality of metal wiring layers is to be provided in the reflection portions, it is also possible to form the reflection portions with a metallic material film made of the same material as at least one metal wiring layer among the metal wiring layers.

[Electronic Apparatus]

The present disclosure is not limited to the application to an imaging device. The present disclosure may also be applied to imaging apparatuses such as digital still cameras and video cameras; portable terminal apparatuses such as mobile phones which have an imaging function; copying machines which use an imaging device as an image-reading part, and other electronic apparatuses in general which use an imaging device as an image-capturing part (photoelectric conversion part). Incidentally, a modular form which can be installed in an electronic apparatus, that is, a camera module, may also be an example of such an imaging device or imaging apparatus.

Figure 20:
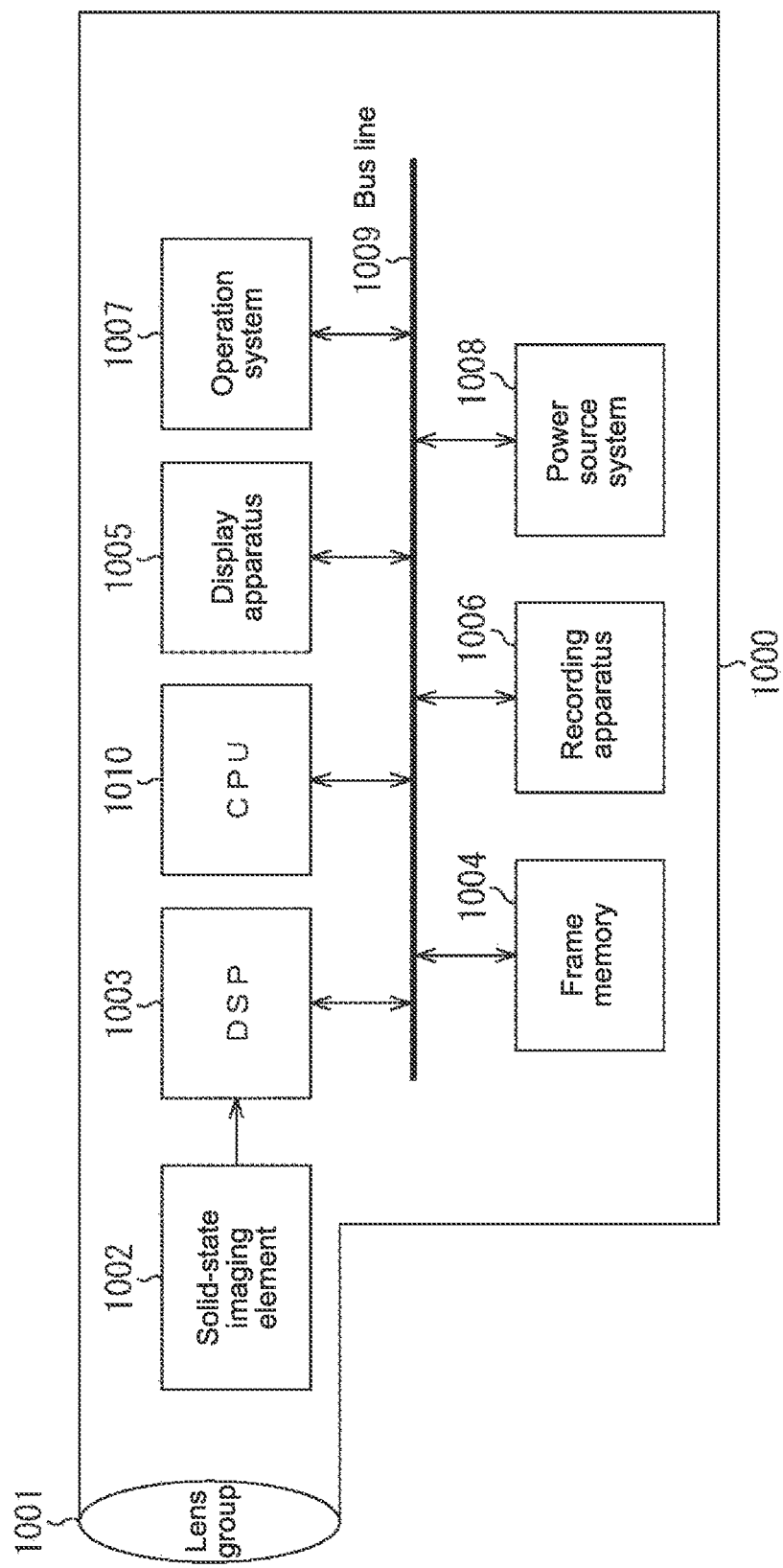
FIG. 20 is a figure for illustrating a structure of an electronic apparatus.

FIG. 20 is a block diagram illustrating an imaging apparatus as an electronic apparatus of one embodiment of the present disclosure. As shown in FIG. 20, the imaging apparatus 1000 of this embodiment includes an optical system including a lens group 1001 and the like; an imaging element 1002; a DSP (digital signal processing) circuit 1003 which is a camera signal processing unit; a frame memory 1004; a display apparatus 1005; a recording apparatus 1006; an operation system 1007; a power source system 1008, and the like.

Further, the DSP circuit 1003, the frame memory 1004, the display apparatus 1005, the recording apparatus 1006, the operation system 1007 and the power source system 1008 are mutually connected via a bus line 1009. A CPU (central processing unit) 1010 is configured to control each part of the imaging apparatus 1000.

The lens group 1001 takes in incident light (image light) from an object and forms an image on an imaging surface of the imaging element 1002. The imaging element 1002 converts an amount of incident light imaged on the imaging surface by the lens group 1001 into an electrical signal per pixel and outputs the signal as a pixel signal.

As this imaging element 1002, for example, a solid-state imaging element configured as an imaging device according to any of the embodiments described above may be used.

The display apparatus 1005 may be made of a panel-type display apparatus such as a liquid crystal display apparatus and an organic EL (electro-luminescence) display apparatus. The display apparatus 1005 is configured to display a video image or a still image taken by the imaging element 1002. The recording apparatus 1006 is configured to record the video image or the still image taken by the imaging element 1002 in a recording medium such as a video tape and a DVD (Digital Versatile Disc).

The operation system 1007 is configured to issue operation commands for various functions provided to this imaging apparatus 1000 based on a user operation. The power source system 1008 is configured to variously supply power as an operation power to the DSP circuit 1003, the frame memory 1004, the display apparatus 1005, the recording apparatus 1006, and the operation system 1007, as appropriate.

Such an imaging apparatus 1000 may be applied to video cameras, digital still cameras and camera modules for mobile equipment such as mobile phones. Furthermore, in such an imaging apparatus 1000, the above-mentioned imaging device according to any of the embodiments may be used as the imaging element 1002.

As used herein, the term "system" represents a whole apparatus including a plurality of devices or apparatuses.

It should be noted that the effects described herein are non-limitative examples. Some embodiments of the present disclosure may also have additional effects.

In addition, the present disclosure is not limited to each of the above-mentioned embodiments and can be variously modified without departing from the gist of the present disclosure.

The present disclosure may employ the following configurations.

(1) A solid-state imaging device, including:
a semiconductor substrate including a light receiving surface;
a plurality of photoelectric conversion parts provided within the semiconductor substrate; and
a plurality of reflection portions provided in the semiconductor substrate on a side of the photoelectric conversion parts that is opposite from the light receiving surface;
where each of the reflection portions includes a reflection plate and a plurality of metal wirings, and where the plurality of metal wirings are disposed in a same layer of the semiconductor substrate as the reflection plate.

(2) The imaging device according to (1), where the reflection plate and each of the plurality of metal wirings do not overlap in a depth direction of the semiconductor substrate.

(3) The imaging device according to (1), where the reflection plate is a secondary set of metal wirings.

(4) The imaging device according to (1), where at least one of the plurality of metal wirings includes a portion having a first film thickness and a portion having a second film thickness that is smaller than the first film thickness.

(5) The imaging device according to (4), where the reflection plate is one of the first film thickness and the second film thickness.

(6) The imaging device according to (4), where at least one of the plurality of metal wirings has a center part having the first film thickness and edge parts having the second film thickness, the center part being between the edge parts.

(7) The imaging device according to (6), where the reflection plate has a center part having one of the first film thickness and the second film thickness, and the reflection plate has edge parts having the other one of the first film thickness and the second film thickness, the center part of the reflection plate being between the edge parts of the reflection plate.

(8) The imaging device according to (6), where each metal wiring that is adjacent to the reflection plate is separated from the reflection plate by a space having a width that inhibits passage of the incident light through the space.

(9) The imaging device according to (8), where the width of the space is approximately 0.25 micrometers or less.

(10) The imaging device according to (3), where each metal wiring in the plurality of metal wirings has a same size and a same shape, and where each metal wiring in the secondary set of metal wirings has the same shape and the same size.

(11) The imaging device according to (1), where a cross section of at least one of the plurality of metal wirings has a triangular shape.

(12) The imaging device according to (1), where a cross section of at least one of the plurality of metal wirings has a trapezoid shape.

(13) The imaging device according to (12), where the trapezoid shape has curved side surfaces.

(14) A method of manufacturing an imaging device, the method including:
providing a semiconductor substrate having a light receiving surface and a plurality of photoelectric conversion parts within the semiconductor substrate; and
providing a plurality of reflection portions in the semiconductor substrate on a side of the photoelectric conversion parts that is opposite from the light receiving surface;
where each of the reflection portions includes a reflection plate and a plurality of metal wirings, and where the plurality of metal wirings are disposed in a same layer of the semiconductor substrate as the reflection plate.

(15) The method of manufacturing an imaging device according to (14), where the reflection plate and each of the plurality of metal wirings do not overlap in a depth direction of the semiconductor substrate.

(16) The method of manufacturing an imaging device according to (14), where each of the reflection portions includes a reflection plate and a plurality of metal wirings, and where at least one of the plurality of metal wirings has a center part having a first film thickness and edge parts having a second film thickness that is smaller than the first film thickness, the center part being between the edge parts.

(17) The method of manufacturing an imaging device according to (16), where the reflection plate has a center part having one of the first film thickness and the second film thickness, and the reflection plate has edge parts having the other one of the first film thickness and the second film thickness, the center part of the reflection plate being between the edge parts of the reflection plate.

(18) An electronic apparatus including:
an imaging device including:
a semiconductor substrate including a light receiving surface;
a plurality of photoelectric conversion parts provided within the semiconductor substrate; and
a plurality of reflection portions provided in the semiconductor substrate on a side of the photoelectric conversion parts that is opposite from the light receiving surface;
where each of the reflection portions includes a reflection plate and a plurality of metal wirings, and where the plurality of metal wirings are disposed in a same layer of the semiconductor substrate as the reflection plate.

(19) The electronic apparatus according to (18), where the electronic apparatus further includes a signal processing unit, the signal processing unit configured to perform signal processing on an image signal output from the solid-state imaging device.

(20) The electronic apparatus according to (18), where the reflection plate and each of the plurality of metal wirings do not overlap in a depth direction of the semiconductor substrate.

(21) An imaging device including:
a semiconductor substrate having
 a light incidence surface,
 a semiconductor substrate surface opposite to the light incidence surface and
 a plurality of photoelectric conversion parts;
and
a plurality of reflection portions provided in the semiconductor substrate surface opposite to the light incidence surface, each of the reflection portions being configured to reflect incident light to a corresponding one of the photoelectric conversion parts, each of the reflection portions including a reflection plate and a plurality of metal wirings,
 at least one of the metal wirings including a part having a first film thickness and a part having a second film thickness smaller than the first film thickness.

(22) The imaging device according to (21), in which
the plurality of reflection portions has at least a region where two of the metal wirings are disposed adjacent to each other, in which region, the part having the second film thickness of at least one of the two of the metal wirings is located.

(23) The imaging device according to (21) or (22), in which
the reflection plate has substantially the same film thickness as the first thickness, and
each of the reflection portions has at least a region where one of the metal wirings and the reflection plate are disposed adjacent to each other, in which region, the part having the second film thickness of the one of the metal wirings is located.

(24) The imaging device according to (21) or (22), in which
the reflection plate has
 at least one edge part having substantially the same film thickness as the first thickness and a center part having substantially the same film thickness as the second thickness, and each of the reflection portions has at least a region where one of the metal wirings and the reflection plate are disposed adjacent to each other, in which region, the part having the second film thickness of the one of the metal wirings and the part of the reflection plate having substantially the first film thickness are located.

(25) The imaging device according to (21) or (22), in which the reflection plate has
a center part having substantially the same film thickness as the first thickness and
at least one edge part having substantially the same film thickness as the second thickness, and each of the reflection portions has at least a region where one of the metal wirings and the reflection plate are disposed adjacent to each other, in which region, the part having the second film thickness of the one of the metal wirings and the part of the reflection plate having substantially the second film thickness are located.

(26) The imaging device according to (21) or (22), in which the reflection plate has substantially the same film thickness as the second thickness, and each of the reflection portions has at least a region where one of the metal wirings and the reflection plate are disposed adjacent to each other, in which region, the part having the second film thickness of the one of the metal wirings is located.

(27) The imaging device according to (21) or (22), in which the reflection plate is configured to also function as one of the metal wirings, and each of the metal wirings includes a part having the first film thickness and a part having the second film thickness.

(28) The imaging device according to (27), in which the metal wirings are disposed adjacent to each other by their parts having the second film thickness.

(29) The imaging device according to (21) or (22), in which the reflection plate is configured to also function as one of the metal wirings, and each of the reflection portions includes
at least one first metal wiring having a part having the first film thickness and a part having the second film thickness and
at least one second metal wiring having the second film thickness.

(30) The imaging device according to (29), in which the first metal wiring is located at an end of each of the reflection portions and
the second metal wiring is located at a center of each of the reflection portions.

(31) The imaging device according to (22), in which the metal wirings disposed adjacent to each other are separated by a space narrower than a space that can inhibit passage of light having a wavelength detectable by the photoelectric conversion parts.

(32) The imaging device according to any one of (21) to (31), in which the plurality of photoelectric conversion parts includes a plurality of photoelectric conversion parts being laminated in a single pixel region.

(33) The imaging device according to (32), in which two of the metal wirings are disposed adjacent to each other, the two of the metal wirings being separated by a space narrower than a space that can inhibit passage of light having a wavelength detectable by a photoelectric conversion part that is close to a reflection portion, among the plurality of photoelectric conversion parts being laminated.

(34) The imaging device according to any one of (21) to (33), in which each of the reflection portions has a different structure depending on a position in an image region where the photoelectric conversion parts are arranged in a matrix.

(35) The imaging device according to (34), in which at least one of the metal wirings of at least one of the reflection portions located at a center of the image region includes a center part having the first film thickness and both edge parts having the second film thickness, at least one of the metal wirings of at least one of the reflection portions located at a right end of the image region includes a right part having the first film thickness and a left part having the second film thickness, and at least one of the metal wirings of at least one of the reflection portions located at a left end of the image region includes a left part having the first film thickness and a right part having the second film thickness.

(36) An apparatus for production of an imaging device, which is configured to produce an imaging device, the imaging device including
a semiconductor substrate having
a light incidence surface,
a semiconductor substrate surface opposite to the light incidence surface and
a plurality of photoelectric conversion parts; and
a plurality of reflection portions provided in the semiconductor substrate surface opposite to the light incidence surface, each of the reflection portions being configured to reflect incident light to a corresponding one of the photoelectric conversion parts, each of the reflection portions including a reflection plate and a plurality of metal wirings,
at least one of the metal wirings including a part having a first film thickness and a part having a second film thickness smaller than the first film thickness.

(37) The apparatus for production according to (36), which is configured to form the reflection portions by
forming an insulating film on the semiconductor substrate,
forming a first recessed portion to the insulating film,
forming a second recessed portion within a predetermined region of the first recessed portion,
forming a metallic material film in the first and second recessed portions, and
polishing the metallic material film, to remove the metallic material film except that formed in the first and second recessed portions.

(38) The apparatus for production according to (36), which is configured to form the reflection portions by
forming an insulating film on the semiconductor substrate, forming a first recessed portion to the insulating film,
forming a second recessed portion containing a region of the first recessed portion,
forming a metallic material film in the first and second recessed portions, and
polishing the metallic material film, to remove the metallic material film except that formed in the first and second recessed portions.

(39) A method for producing an imaging device, the method including:
providing a semiconductor substrate having
a light incidence surface,
a semiconductor substrate surface opposite to the light incidence surface and
a plurality of photoelectric conversion parts; and
providing a plurality of reflection portions in the semiconductor substrate surface opposite to the light incidence surface, each of the reflection portions being configured to reflect incident light to a corresponding one of the photoelectric conversion parts, each of the reflection portions including a reflection plate and a plurality of metal wirings,
at least one of the metal wirings including a part having a first film thickness and a part having a second film thickness smaller than the first film thickness, to produce the imaging device.

(40) An electronic apparatus including:
an imaging device including
a semiconductor substrate having
a light incidence surface,
a semiconductor substrate surface opposite to the light incidence surface and
a plurality of photoelectric conversion parts, and
a plurality of reflection portions provided in the semiconductor substrate surface opposite to the light incidence surface, each of the reflection portions being configured to reflect incident light to a corresponding one of the photoelectric conversion parts, each of the reflection portions including a reflection plate and a plurality of metal wirings,
at least one of the metal wirings including a part having a first film thickness and a part having a second film thickness smaller than the first film thickness; and
a signal processing unit configured to perform signal processing on an image signal output from the imaging device.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a semiconductor substrate including a light receiving surface;
a plurality of photoelectric conversion parts provided within the semiconductor substrate; and
a plurality of reflection portions provided on a side of the photoelectric conversion parts that is opposite from the light receiving surface;
wherein each of the reflection portions includes a reflection plate and a plurality of metal wirings,
wherein the plurality of metal wirings are disposed in a same layer as the reflection plate,
wherein for at least one of the reflection portions, the reflection plate and the metal wirings of the at least one reflection portion are each in contact with only a same material in a cross-sectional view of the solid-state imaging device,
wherein the same material is in direct contact with the semiconductor substrate having the plurality of photoelectric conversion parts provided within,
wherein the reflection plate does not overlap with each of the plurality of metal wirings and each of the plurality of metal wirings do not overlap with one another in a depth direction of the solid-state imaging device, and
wherein at least one side of each of the metal wirings and the reflection plate are each disposed at a same distance, when measured in a same direction, from an edge of the semiconductor substrate.

2. The imaging device according to claim 1, wherein the reflection plate is a secondary set of metal wirings.

3. The imaging device according to claim 2, wherein each metal wiring in the plurality of metal wirings has a same size and a same shape, and wherein each metal wiring in the secondary set of metal wirings has the same shape and the same size.

4. The imaging device according to claim 1, wherein at least one of the plurality of metal wirings includes a portion having a first film thickness and a portion having a second film thickness that is smaller than the first film thickness.

5. The imaging device according to claim 4, wherein the reflection plate is one of the first film thickness and the second film thickness.

6. The imaging device according to claim 4, wherein at least one of the plurality of metal wirings has a center part having the first film thickness and edge parts having the second film thickness, the center part being between the edge parts.

7. The imaging device according to claim 6, wherein the reflection plate has a center part having one of the first film thickness and the second film thickness, and the reflection plate has edge parts having the other one of the first film thickness and the second film thickness, the center part of the reflection plate being between the edge parts of the reflection plate.

8. The imaging device according to claim 6, wherein each metal wiring that is adjacent to the reflection plate is separated from the reflection plate by a space having a width that inhibits passage of the incident light through the space, and wherein the width of the space is approximately 0.25 micrometers or less.

9. The imaging device according to claim 1, wherein a cross section of at least one of the plurality of metal wirings has a triangular shape.

10. The imaging device according to claim 1, wherein a cross section of at least one of the plurality of metal wirings has a trapezoid shape.

11. The imaging device according to claim 10, wherein the trapezoid shape has curved side surfaces.

12. The imaging device according to claim 1, wherein the same material is an insulating film.

13. The imaging device according to claim 12, wherein the insulating film is in direct contact with a side of the semiconductor substrate that extends continuously from under a first photoelectric conversion part to under a second photoelectric conversion part, when measured in the same direction, and wherein the plurality of photoelectric conversion parts comprise the first photoelectric conversion part and the second photoelectric conversion part.

14. A method of manufacturing a solid-state imaging device, the method comprising:
- providing a semiconductor substrate having a light receiving surface and a plurality of photoelectric conversion parts within the semiconductor substrate; and
- providing a plurality of reflection portions on a side of the photoelectric conversion parts that is opposite from the light receiving surface;
- wherein each of the reflection portions includes a reflection plate and a plurality of metal wirings,
- wherein the plurality of metal wirings are disposed in a same layer as the reflection plate,
- wherein for at least one of the reflection portions, the reflection plate and the metal wirings of the at least one reflection portion are each in contact with only a same material in a cross-sectional view of the solid-state imaging device,
- wherein the same material is in direct contact with the semiconductor substrate having the plurality of photoelectric conversion parts provided within,
- wherein the reflection plate does not overlap with each of the plurality of metal wirings and each of the plurality of metal wirings do not overlap with one another in a depth direction of the solid-state imaging device, and
- wherein at least one side of each of the metal wirings and the reflection plate are each disposed at a same distance, when measured in a same direction, from an edge of the semiconductor substrate.

15. The method of manufacturing an imaging device according to claim 14, wherein sides of the metal wirings that are adjacent to sides of the reflection plate are not parallel to the sides of the reflection plate.

16. The method of manufacturing an imaging device according to claim 14, wherein each of the reflection portions includes a reflection plate and a plurality of metal wirings, and wherein at least one of the plurality of metal wirings has a center part having a first film thickness and edge parts having a second film thickness that is smaller than the first film thickness, the center part being between the edge parts.

17. The method of manufacturing an imaging device according to claim 16, wherein the reflection plate has a center part having one of the first film thickness and the second film thickness, and the reflection plate has edge parts having the other one of the first film thickness and the second film thickness, the center part of the reflection plate being between the edge parts of the reflection plate.

18. An electronic apparatus comprising:
a solid-state imaging device including:
- a semiconductor substrate including a light receiving surface;
- a plurality of photoelectric conversion parts provided within the semiconductor substrate; and
- a plurality of reflection portions provided on a side of the photoelectric conversion parts that is opposite from the light receiving surface;
- wherein each of the reflection portions includes a reflection plate and a plurality of metal wirings,
- wherein the plurality of metal wirings are disposed in a same layer as the reflection plate,
- wherein for at least one of the reflection portions, the reflection plate and the metal wirings of the at least one reflection portion are each in contact with only a same material in a cross-sectional view of the solid-state imaging device,
- wherein the same material is in direct contact with the semiconductor substrate having the plurality of photoelectric conversion parts provided within,
- wherein the reflection plate does not overlap with each of the plurality of metal wirings and each of the plurality of metal wirings do not overlap with one another in a depth direction of the solid-state imaging device, and
- wherein at least one side of each of the metal wirings and the reflection plate are each disposed at a same distance, when measured in a same direction, from an edge of the semiconductor substrate.

19. The electronic apparatus according to claim 18, wherein the electronic apparatus further comprises a signal processing unit, the signal processing unit configured to perform signal processing on an image signal output from the solid-state imaging device.

20. The electronic apparatus according to claim 18, wherein a height of the reflection plate is in a first direction in the same layer, and each of the plurality of metal wirings are disposed in a second direction and the plurality of metal wirings do not exceed the height in the first direction, wherein the second direction is perpendicular to the first direction.

* * * * *